US012796256B2

(12) United States Patent
Jeong et al.

(10) Patent No.: US 12,796,256 B2
(45) **Date of Patent: *Nov. 10, 2026**

(54) DISPLAY PANEL AND ELECTRONIC APPARATUS

(71) Applicant: SAMSUNG DISPLAY CO., LTD., Yongin-si (KR)

(72) Inventors: Junki Jeong, Yongin-si (KR); Seonyoung Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 19/218,611

(22) Filed: May 26, 2025

(65) Prior Publication Data

US 2025/0287802 A1 Sep. 11, 2025

Related U.S. Application Data

(63) Continuation of application No. 17/723,114, filed on Apr. 18, 2022, now Pat. No. 12,317,704.

(30) Foreign Application Priority Data

Jun. 24, 2021 (KR) ........................ 10-2021-0082335

(51) Int. Cl.
*H10K 59/131* (2023.01)
*G09G 3/32* (2016.01)
(Continued)

(52) U.S. Cl.
CPC ............. *H10K 59/131* (2023.02); *G09G 3/32* (2013.01); *G09G 3/3233* (2013.01);
(Continued)

(58) Field of Classification Search
CPC ...... G09G 3/32; G09G 3/3233; H10K 59/131; H10K 59/123
See application file for complete search history.

(56) References Cited

U.S. PATENT DOCUMENTS 10,852,607 B2 12/2020 Yeh et al.
11,659,744 B2 * 5/2023 Jung .................... H10K 59/131 257/40

(Continued)

FOREIGN PATENT DOCUMENTS

CN 110047897 A 7/2019
CN 110874990 A 3/2020

(Continued)

*Primary Examiner* — Sardis F Azongha
(74) *Attorney, Agent, or Firm* — Womble Bond Dickinson (US) LLP

(57) ABSTRACT

A display panel may include a first display area, a second display area, and a third display area. A plurality of first light-emitting diodes may be arranged in the first display area, a plurality of second light-emitting diodes and a transmission area may be arranged in the second display area, and a plurality of third light-emitting diodes may be arranged in the third display area. The display panel may include a peripheral area outside the display area, a plurality of first sub-pixel circuits respectively electrically connected to the plurality of first light-emitting diodes, a plurality of second sub-pixel circuits respectively electrically connected to the plurality of second light-emitting diodes, and a plurality of third sub-pixel circuits respectively electrically connected to the plurality of third light-emitting diodes.

20 Claims, 19 Drawing Sheets

(51) Int. Cl.
*G09G 3/3233* (2016.01)
*H10K 59/123* (2023.01)

(52) U.S. Cl.
CPC ... *H10K 59/123* (2023.02); *G09G 2300/0413* (2013.01); *G09G 2300/0426* (2013.01)

(56) References Cited

U.S. PATENT DOCUMENTS

| | | | |
|---|---|---|---|
| 11,862,081 | B2 | 1/2024 | Cheng et al. |
| 2016/0380038 | A1 | 12/2016 | Kang et al. |
| 2017/0372661 | A1 | 12/2017 | Gu et al. |
| 2020/0052048 | A1 | 2/2020 | Kuo et al. |
| 2020/0235187 | A1 | 7/2020 | Bae et al. |
| 2021/0193758 | A1 | 6/2021 | Choi et al. |
| 2021/0399080 | A1 | 12/2021 | Lee et al. |
| 2022/0069047 | A1 | 3/2022 | Yang et al. |

FOREIGN PATENT DOCUMENTS

| | | | |
|---|---|---|---|
| CN | 111063719 | A | 4/2020 |
| CN | 111180494 | A | 5/2020 |
| KR | 10-2017-0002730 | A | 1/2017 |
| KR | 10-2018-0000771 | A | 1/2018 |
| KR | 10-2020-0046223 | A | 5/2020 |
| KR | 10-2020-0090299 | A | 7/2020 |

* cited by examiner

DISPLAY PANEL AND ELECTRONIC APPARATUS

CROSS-REFERENCE TO RELATED APPLICATIONS

This application is a continuation of U.S. patent application Ser. No. 17/723,114, filed Apr. 18, 2022, which claims priority to and the benefit of Korean Patent Application No. 10-2021-0082335, filed Jun. 24, 2021, the entire content of both of which is incorporated herein by reference.

BACKGROUND

1. Field

One or more embodiments relate to a display panel and a structure of an electronic apparatus including the display panel.

2. Description of the Related Art

A display panel is an apparatus for visually displaying data. Over time, the usage of display apparatuses has diversified. As display apparatuses have become thinner and lighter, their range of use have gradually expanded.

To add various functions while expanding the area occupied by a display area, research is being carried out on display panels to add functions, other than displaying image inside the display area.

The above information disclosed in this Background section is only for enhancement of understanding of the background and therefore the information discussed in this Background section does not necessarily constitute prior art.

SUMMARY

One or more embodiments include a display panel including a transmission area inside a display area and a structure of an electronic apparatus including the display panel.

Additional aspects will be set forth in part in the description which follows, and in part, will be apparent from the description, or may be learned by practice of the described embodiments of the present disclosure.

According to one or more embodiments, a display panel including a display area is described. The display panel may include a first display area, a second display area, and a third display area, a plurality of first light-emitting diodes being arranged in the first display area, a plurality of second light-emitting diodes and a transmission area being arranged in the second display area, and a plurality of third light-emitting diodes being arranged in the third display area, a peripheral area outside the display area, a plurality of first sub-pixel circuits respectively electrically connected to the plurality of first light-emitting diodes, a plurality of second sub-pixel circuits respectively electrically connected to the plurality of second light-emitting diodes, and a plurality of third sub-pixel circuits respectively electrically connected to the plurality of third light-emitting diodes, wherein the plurality of second sub-pixel circuits are arranged in the peripheral area and electrically connected to the plurality of second light-emitting diodes through a plurality of conductive bus lines crossing the third display area between the peripheral area and the second display area.

Each conductive bus line of the plurality of conductive bus lines may include a first portion in the second display area and a second portion crossing the third display area, the first portion including a material different from a material of the second portion.

The first portion may include a higher light transmittance than the second portion, and the second portion may include a higher conductivity than the first portion.

The first portion may include a transparent conductive oxide, and the second portion includes a metal layer.

The adjacent ones of the second portions may be arranged on different layers.

The first portion and the second portion of one of the plurality of conductive bus lines may be arranged at a first layer and are electrically connected to each other by a bridge electrode arranged at a second layer different from the first layer.

The first portion and the second portion of one of the plurality of conductive bus lines may be arranged on different layers and connected to each other by an insulating layer therebetween.

The display panel may further include an electrode voltage line extending in one direction in the third display area, wherein the electrode voltage line includes an upper electrode of a storage capacitor of each third sub-pixel circuit of the plurality of third sub-pixel circuits arranged in the one direction, and wherein each conductive bus line of the plurality of conductive bus lines overlap the electrode voltage line in the third display area.

The plurality of first sub-pixel circuits may be arranged in the first display area, and the plurality of third sub-pixel circuits may be arranged in the third display area.

The display panel may further include: a plurality of first data lines electrically connected to the plurality of first sub-pixel circuits, a plurality of second data lines spaced apart from the plurality of first data lines, wherein the second display area is between the plurality of second data lines and the plurality of first data lines, and a plurality of data connection lines electrically connecting the plurality of first data lines to the plurality of second data lines, wherein each second data line of the plurality of second data lines is electrically connected to a corresponding second sub-pixel circuit of the plurality of second sub-pixel circuits and a corresponding third sub-pixel circuit of the plurality of third sub-pixel circuits arranged at a same column.

The display panel may further include a dummy sub-pixel circuit arranged in the third display area.

The dummy sub-pixel circuit may be arranged at a same row as at least one of the plurality of first sub-pixel circuits.

Each of the plurality of first sub-pixel circuits may include a first driving transistor including a first driving semiconductor layer, wherein each of the plurality of second sub-pixel circuits includes a second driving transistor including a second driving semiconductor layer, wherein each of the plurality of third sub-pixel circuits includes a third driving transistor including a third driving semiconductor layer, and wherein a shape of the first driving semiconductor layer is different from the shape of the second driving semiconductor layer and different from the shape of the third driving semiconductor layer.

Each of the plurality of first sub-pixel circuits may include a first storage capacitor, wherein each of the plurality of second sub-pixel circuits includes a second storage capacitor, wherein each of the plurality of third sub-pixel circuits includes a third storage capacitor, and wherein a capacity the second storage capacitor and a capacity of the third storage capacitor is greater than a capacity of the first storage capacitor.

According to one or more embodiments, an electronic apparatus is described. The electronic apparatus may include: a display panel including a display area including a first display area, a second display area, and a third display area, a plurality of first light-emitting diodes being arranged in the first display area, a plurality of second light-emitting diodes and a transmission area being arranged in the second display area, and a plurality of third light-emitting diodes being arranged in the third display area, and a component overlapping the transmission area of the display panel, wherein the display panel further includes: a plurality of first sub-pixel circuits arranged in the first display area and respectively electrically connected to the plurality of first light-emitting diodes, a plurality of second sub-pixel circuits respectively electrically connected to the plurality of second light-emitting diodes, and a plurality of third sub-pixel circuits arranged in the third display area and respectively electrically connected to the plurality of third light-emitting diodes, wherein the plurality of second sub-pixel circuits are arranged in a peripheral area outside the display area and electrically connected to the plurality of second light-emitting diodes through a plurality of conductive bus lines crossing the third display area between the peripheral area and the second display area.

The plurality of conductive bus lines may each include: a first portion arranged in the second display area and electrically connected to the second light-emitting diode, and a second portion arranged in the third display area and electrically connected to the first portion and the second sub-pixel circuit, and wherein the first portion and the second portion include different materials.

The first portion may include a transparent conductive oxide.

The first portion and the second portion of one of the plurality of conductive bus lines may be arranged at a first layer and electrically connected to each other by a bridge electrode arranged at a second layer different from the first layer.

The first portion and the second portion of one of the plurality of conductive bus lines may be arranged on different layers and connected to each other by an insulating layer therebetween.

The display panel may further include an electrode voltage line extending in one direction in the third display area, wherein the electrode voltage line includes an upper electrode of a storage capacitor of each third sub-pixel circuit of the plurality of third sub-pixel circuits arranged in the one direction, and wherein each conductive bus line of the plurality of conductive bus lines overlap the electrode voltage line in the third display area.

Two adjacent conductive bus lines of the plurality of conductive bus lines may be arranged at different layers in the third display area.

The display panel may further include: a plurality of first data lines electrically connected to the plurality of first sub-pixel circuits, a plurality of second data lines spaced apart from the plurality of first data lines with the second display area therebetween, and a plurality of data connection lines electrically connecting the plurality of first data lines to the plurality of second data lines, and wherein each second data line of the plurality of second data lines is electrically connected to a corresponding second sub-pixel circuit of the plurality of second sub-pixel circuits and a corresponding third sub-pixel circuit of the plurality of third sub-pixel circuits arranged at a same column.

The display panel may further include a dummy sub-pixel circuit arranged in the third display area.

The dummy sub-pixel circuit may be arranged at a same row as at least one of the plurality of first sub-pixel circuits.

Each of the plurality of first sub-pixel circuits may include a first driving transistor including a first driving semiconductor layer, wherein each of the plurality of second sub-pixel circuits includes a second driving transistor including a second driving semiconductor layer, wherein each of the plurality of third sub-pixel circuits includes a third driving transistor including a third driving semiconductor layer, and wherein a shape of the first driving semiconductor layer is different from the shape of the second driving semiconductor layer and different from the shape of the third driving semiconductor layer.

Each of the plurality of first sub-pixel circuits may include a first storage capacitor, wherein each of the plurality of second sub-pixel circuits includes a second storage capacitor, wherein each of the plurality of third sub-pixel circuits includes a third storage capacitor, and wherein a capacity the second storage capacitor and a capacity of the third storage capacitor is greater than a capacity of the first storage capacitor.

Accordingly, one or more embodiments provide an electronic apparatus such as a display panel that includes a first, second, and a third display area, and a peripheral area outside the display area, and each display area having a plurality of light-emitting diodes. Moreover, in some embodiments, a sub-pixel circuitry corresponding to the light-emitting diodes is located in the peripheral area.

BRIEF DESCRIPTION OF THE DRAWINGS

The above and other aspects of the embodiments of the disclosure will be more apparent from the following description taken in conjunction with the accompanying drawings, in which.

DETAILED DESCRIPTION

Figure 1:
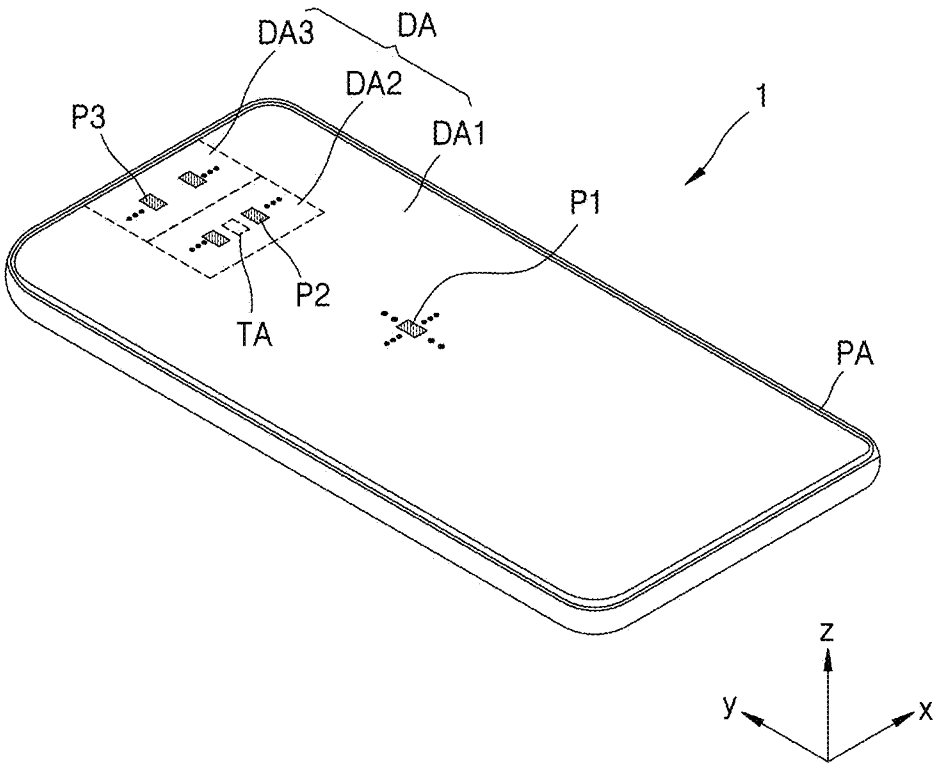
FIG. 1 is a perspective view of an electronic apparatus according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of an electronic apparatus 1 according to some embodiments.

Referring to FIG. 1, the electronic apparatus 1 may include a display area DA and a peripheral area PA outside the display area DA. The display area DA may be configured to display images through sub-pixels. The peripheral area PA is arranged outside the display area DA and is a non-display area in which images are not displayed. The peripheral area PA may surround the display area DA substantially (e.g., entirely). A driver and the like may be arranged in the peripheral area PA, the driver and the like providing electric signals or power to the display area DA. A pad may be arranged in the peripheral area PA, the pad being a region to which electronic elements or a printed circuit board, and the like may be electrically connected.

Hereinafter, although the case where the electronic apparatus 1 being a smartphone is described for convenience of explanation, the electronic apparatus 1 according to the various embodiments are not limited thereto. The electronic apparatus 1 may be applicable to various products including, for example, televisions, notebook computers, monitors, advertisement boards, Internet of things (IoT), as well as portable electronic apparatuses including mobile phones, smart phones, tablet personal computers (PC), mobile communication terminals, electronic organizers, electronic books, portable multimedia players (PMP), navigations, and ultra mobile personal computers (UMPC). In addition, the electronic apparatus 1 according to some embodiments may be applicable to wearable devices including smartwatches, watchphones, glasses-type displays, and head-mounted displays (HMD). In addition, the electronic apparatus 1 may be applicable to instrument panels for automobiles, center fascias for automobiles, or center information displays (CID) arranged on a dashboard, room mirror displays that replace side mirrors of automobiles, and displays arranged behind the front seats (e.g., on the backside of the front seats) as an entertainment for backseat passengers of automobiles.

The display area DA may include a first display area DA1, a second display area DA2, and a third display area DA3. The first display area DA1 may display images by using first sub-pixels P1 arranged two-dimensionally, the second display area DA2 may display images by using second sub-pixels P2, and the third display area DA3 may display images by using third sub-pixels P3.

In some embodiments, the first display area DA1 may display a first image by using light emitted from a plurality of first sub-pixels P1, the second display area DA2 may display a second image by using light emitted from a plurality of second sub-pixels P2, and the third display area DA3 may display a third image by using light emitted from a plurality of third sub-pixels P3. The first image, the second image, and the third image may be a portion of one image displayed by the electronic apparatus 1. In other embodiments, at least one of the first image, the second image, or the third image may be displayed as a separate image independent of the rest of the images.

The first display area DA1 may occupy a substantial area (e.g., most of the area) of the display area DA. The second display area DA2 may be arranged inside the display area DA. The third display area DA3 may be adjacent to the second display area DA2 and be arranged between the peripheral area PA and the second display area DA2. According to some embodiments, FIG. 1 shows that the second display area DA2 is arranged in the center on the upper side (a +y-direction) of the display area DA, and the third display area DA3 is arranged between the second display area DA2 and the peripheral area PA in one direction (e.g., the +y-direction).

The second display area DA2 and the third display area DA3 may each have an area less than that of the first display area DA1 and have a shape that is partially surrounded by the first display area DA1. As an example, the first display area DA1 may have an approximately U-shaped notch shape. The second display area DA2 and the third display area DA3 may be arranged at the notch portion of the first display area DA1, and thus, the display area DA may have an approximately quadrangular shape.

Although it is shown in FIG. 1 that the second display area DA2 and the third display area DA3 are arranged in the center on the upper side (the +y-direction) of the display area DA and having an approximately quadrangular shape in a direction approximately perpendicular to the upper surface of the electronic apparatus 1, the embodiment is not limited thereto. The second display area DA2 may be arranged, for example, on the upper right side or the upper left side of the display area DA. Even in this case, the third display area DA3 may be arranged between the second display area DA2 and the peripheral area PA.

Figure 2:
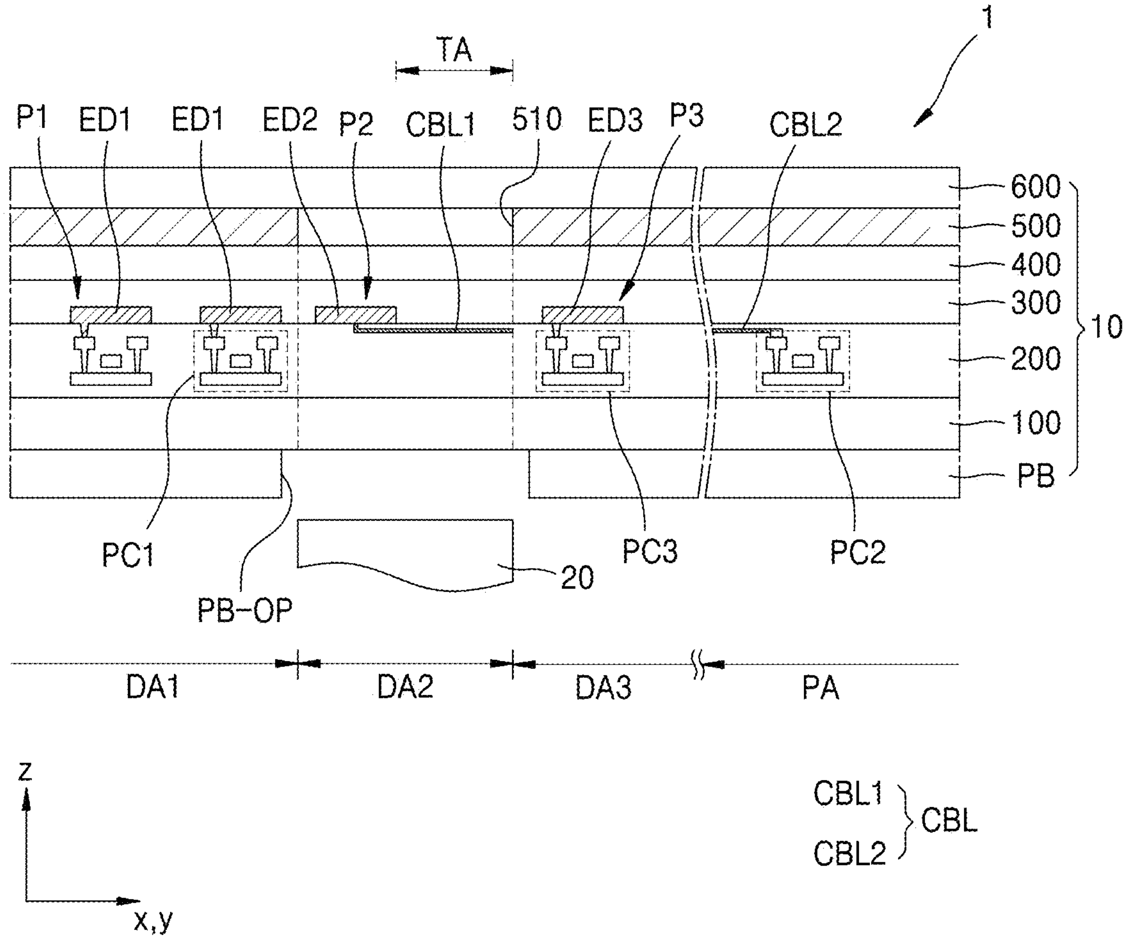
FIG. 2 is a cross-sectional view of an electronic apparatus according to some embodiments.

The second display area DA2 may include a transmission area TA. The transmission area TA may be arranged between the second sub-pixels P2 and is a region through which light and/or sound may pass. As shown in FIG. 2 below, a component 20 (see FIG. 2) may be arranged in the second display area DA2.

Because the second display area DA2 includes the transmission area TA, the resolution of the first display area DA1 may be different from the resolution of the second display area DA2. In some embodiments, the resolution of the second display area DA2 may be lower than that of the first display area DA1. For example, the number of second sub-pixels P2 per a given area in the second display area DA2 may be less than the number of first sub-pixels P1 per a given area of the same size in the first display area DA1. As an example, the resolution of the second display area DA2 may be about ½, ⅜, ⅓, ¼, 2/9, ⅛, 1/9, or 1/16 of the resolution of the first display area DA1. As an example, the resolution of the first display area DA1 may be about 450 ppi or more, and the resolution of the second display area DA2 may be about 100 ppi to about 200 ppi.

The resolution of the third display area DA3 may be the same as the resolution of the second display area DA2. Alternatively, the resolution of the third display area DA3 may be greater than the resolution of the second display area DA2 and less than the resolution of the first display area DA1. As an example, the resolution of the third display area DA3 may be about 100 ppi to about 200 ppi, or about 200 ppi to about 400 ppi.

FIG. 2 is a cross-sectional view of the electronic apparatus 1 according to some embodiments.

Referring to FIG. 2, the electronic apparatus 1 may include a display panel 10 and a component 20 overlapping the display panel 10. The component 20 may be arranged in the second display area DA2.

The component 20 may be an electronic element that uses light or sound. As an example, the electronic element may be a sensor that measures a distance such as a proximity sensor, a sensor that recognizes a portion of a user's body such as a fingerprint, an iris, or a face, a small lamp that outputs light, or an image sensor that captures an image such as a camera. The electronic element that uses light may use light in various wavelength bands such as visible light, infrared light, or ultraviolet light. The electronic element that uses sound may use ultrasonic waves or sounds in different frequency bands.

The second display area DA2 may include the transmission area TA through which light and/or sound output may pass from the component 20 to the outside, or may progress toward the component 20 from the outside. In some embodiments, the transmission area TA is a region through which light may pass. Sub-pixels P are not arranged in the transmission area TA. In the electronic apparatus 1 according to some embodiments, when light passes through the second display area DA2 including the transmission area TA, a light transmittance may be 10% or more, preferably 25% or more, 40% or more, 50% or more, 85% or more, or 90% or more.

The first sub-pixel P1, the second sub-pixel P2, and the third sub-pixel P3 described above with reference to FIG. 1 may each emit light by using a light-emitting diode. Each light-emitting diode may be arranged in the display area DA (see FIG. 1) of the display panel 10. Accordingly, FIG. 2 shows that a first light-emitting diode ED1, a second light-emitting diode ED2, and a third light-emitting diode ED3 are arranged over the substrate 100, the first light-emitting diode ED1 corresponding to the first sub-pixel P1, the second light-emitting diode ED2 corresponding to the second sub-pixel P2, and the third light-emitting diode ED3 corresponding to the third sub-pixel P3.

The substrate 100 may include an insulating material such as glass or a polymer resin. A protective film PB may be arranged on the backside of the substrate 100. The substrate 100 may be a rigid substrate or a flexible substrate that is bendable, foldable, and/or rollable. The protective film PB may include an opening PB-OP arranged in the second display area DA2 to improve a transmittance of the transmission area TA.

The first light-emitting diode ED1 is arranged in the first display area DA1 and electrically connected to a first sub-pixel circuit PC1 arranged in the first display area DA1. The first sub-pixel circuit PC1 may include transistors and a storage capacitor electrically connected to the transistors.

The second light-emitting diode ED2 is arranged in the second display area DA2. Although the second light-emitting diode ED2 is electrically connected to the second sub-pixel circuit PC2, the second sub-pixel circuit PC2 is not arranged in the second display area DA2 to improve a transmittance and a transmission area of the transmission area TA provided in the second display area DA2. Instead, the second sub-pixel circuit PC2 is arranged in the peripheral area PA. The second light-emitting diode ED2 may be electrically connected to the second sub-pixel circuit PC2 through a conductive bus line CBL.

The conductive bus line CBL may extend to connect the second sub-pixel circuit PC2 in the peripheral area PA to the second light-emitting diode ED2 in the second display area DA2. The conductive bus line CBL may include a first portion CBL1 and a second portion CBL2, the first portion CBL1 being connected to the second light-emitting diode ED2, and the second portion CBL2 being connected to the second sub-pixel circuit PC2. In some embodiments, the first portion CBL1 and the second portion CBL2 may be arranged on different layers and electrically connected to each other in the display area DA. The first portion CBL1 and the second portion CBL2 may include different materials. The first portion CBL1 may have a higher light transmittance than that of the second portion CBL2. The second portion CBL2 may have a higher conductivity than that of the first portion CBL1. The first portion CBL1 passing across (e.g., crossing) the transmission area TA may include a light transmissive material, for example, a transparent conductive oxide (TCO). The first portion CBL1 may include a metal layer.

The third light-emitting diode ED3 is arranged in the third display area DA3 and electrically connected to the third sub-pixel circuit PC3 arranged in the third display area DA3. The third sub-pixel circuit PC3 may include transistors and a storage capacitor electrically connected to the transistors.

The first to third light-emitting diodes ED1, ED2, and ED3 may each be light-emitting elements that emit light of a preset color and may each include an organic light-emitting diode. In other embodiments, the first to the third light-emitting diodes ED1, ED2, and ED3 may each include an inorganic light-emitting diode or a light-emitting diode including quantum dots.

The first to the third light-emitting diodes ED1, ED2, and ED3 may be covered by an encapsulation layer 300. The encapsulation layer 300 may include an inorganic encapsulation layer and an organic encapsulation layer, wherein the inorganic encapsulation layer includes an inorganic insulating material, and the organic encapsulation layer includes an organic insulating material. In some embodiments, the encapsulation layer 300 may include first and second inorganic encapsulation layers and an organic encapsulation layer therebetween.

The encapsulation layer 300 may be an encapsulation substrate including glass. Sealant including frit may be arranged between the substrate 100 and the encapsulation substrate. Sealant may be arranged in the peripheral area PA, may extend to surround the display area DA (see FIG. 1), and reduce (e.g., prevent) moisture from penetrating toward the first to third light-emitting diodes ED1, ED2, and ED3 through lateral surfaces thereof.

An input sensing layer 400 may be arranged on the encapsulation layer 300. The input sensing layer 400 may obtain coordinate information corresponding to a touch event by an object such as a finger or a stylus pen. The input sensing layer 400 may include a touch electrode and trace lines connected to the touch electrode. The input sensing layer 400 may sense an external input by using a mutual capacitive method or a self capacitive method.

An optical functional layer 500 may include an anti-reflection layer. The anti-reflection layer may reduce reflectivity of light (e.g., external light) that is incident toward the display panel 10 from the outside through a cover window 600. The anti-reflection layer may include a retarder and a polarizer. The optical functional layer 500 may improve a transmittance of the transmission area TA by including an opening 510 arranged in the second display area DA2.

In other embodiments, the anti-reflection layer may include a black matrix and color filters. The color filters may be arranged by taking into account colors of light emitted respectively from the first to third light-emitting diodes ED1, ED2, and ED3. In other embodiments, the anti-reflection layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

The cover window 600 may be arranged on the optical functional layer 500. The cover window 600 may be coupled to the optical functional layer 500 through an adhesive layer such as an optical transparent adhesive therebetween. The cover window 600 may include glass or a plastic material. The plastic material may include polyethersulfone, polyacrylate, polyetherimide, polyethylene naphthalate, polyethylene terephthalate, polyphenylene sulfide, polyarylate, polyimide, polycarbonate, and/or cellulose acetate propionate.

The cover window 600 may include a flexible cover window. As an example, the cover window 600 may include a polyimide cover window or an ultra-thin glass cover window.

Figure 3:
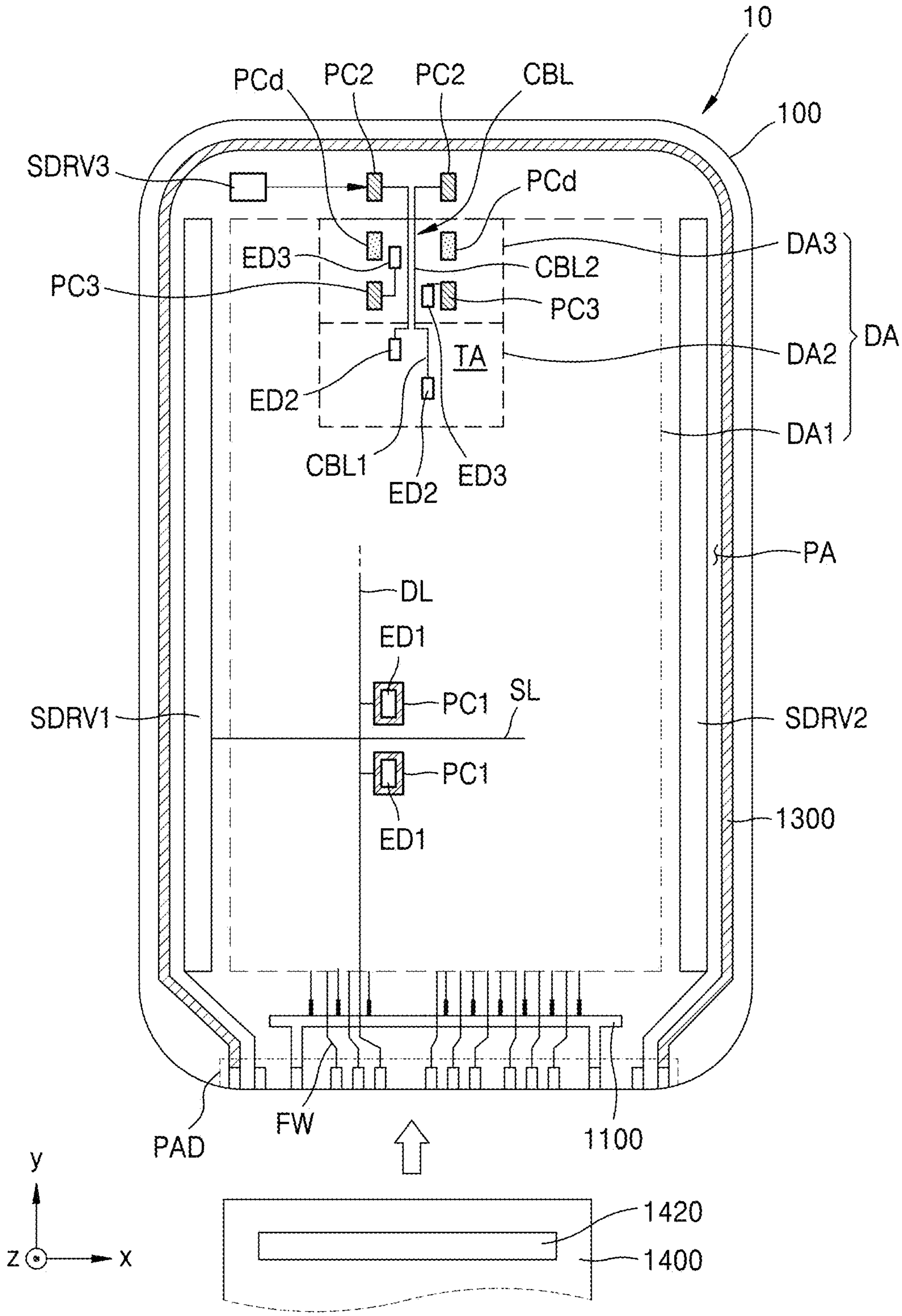
FIG. 3 is a plan view of a display panel according to some embodiments.

FIG. 3 is a plan view of the display panel 10 according to some embodiments.

Referring to FIG. 3, the first light-emitting diode ED1 is arranged in the first display area DA1. Light emitted from the first light-emitting diode ED1 may correspond to light of the first sub-pixel P1 (see FIG. 1) described above with reference to FIG. 1. A position of the first light-emitting diode ED1 may be a position of the first sub-pixel P1 (see FIG. 1). The first light-emitting diode ED1 may emit, for example, red, green, or blue light. The first sub-pixel circuit PC1 that drives the first light-emitting diode ED1 may be arranged in the first display area DA1 and electrically connected to the first light-emitting diode ED1.

The first sub-pixel circuit PC1 is electrically connected to a scan line SL and a data line DL, the scan line SL extending in a first direction (e.g., an x-direction), and the data line DL extending in a second direction (e.g., a y-direction). A first scan driving circuit SDRV1 and a second scan driving circuit SDRV2 may be arranged in the peripheral area PA, the first scan driving circuit SDRV1 and the second scan driving circuit SDRV2 being configured to provide signals to the first sub-pixel circuit PC1.

The first scan driving circuit SDRV1 may apply a scan signal to each of the first sub-pixel circuits PC1 through the scan line SL. The second scan driving circuit SDRV2 may be arranged opposite the first scan driving circuit SDRV1 with the first display area DA1 therebetween. Some of the first sub-pixel circuits PC1 in the first display area DA1 may be electrically connected to the first scan driving circuit SDRV1, and the rest may be electrically connected to the second scan driving circuit SDRV2.

A pad PAD may be arranged on one side of the substrate 100. The pad PAD is not covered by an insulating layer and may be exposed and connected to a circuit board 1400. A control driver 1420 may be arranged on the circuit board 1400, the control driver 1420 including a data driving circuit.

The control driver 1420 may generate control signals transferred to the first scan driving circuit SDRV1 and the second scan driving circuit SDRV2. The control driver 1420 may include the data driving circuit. The data driving circuit may generate data signals. Generated data signals may be transferred to the first sub-pixel circuit PC1 through a fan-out wiring FW and the data line DL, the fan-out wiring FW being arranged in the peripheral area PA of the display panel 10, and the data line DL being connected to the fan-out wiring FW.

The second light-emitting diode ED2 is arranged in the second display area DA2. Light emitted from the second light-emitting diode ED2 may correspond to light of the second sub-pixel P2 (see FIG. 1) described above with reference to FIG. 1. A position of the second light-emitting diode ED2 may be a position of the second sub-pixel P2 (see FIG. 1). The second light-emitting diode ED2 may emit, for example, red, green, or blue light. As described above with reference to FIG. 1, the resolution of the second display area DA2 may be lower than the resolution of the first display area DA1. Accordingly, the number of second light-emitting diodes ED2 per given area in the second display area DA2 may be less than the number of first light-emitting diodes ED1 per given area of the same size in the first display area DA1.

The transmission area TA may be arranged between the second light-emitting diodes ED2. In some embodiments, a region of the second display area DA2 in which the second light-emitting diodes ED2 are not arranged may correspond to the transmission area TA. To increase the area of the transmission area TA and improve a transmittance of the transmission area TA, the second sub-pixel circuit PC2 may be arranged in the peripheral area PA outside the display area DA, the second sub-pixel circuit PC2 being configured to drive the second light-emitting diode ED2. Accordingly, FIG. 3 shows that second sub-pixel circuits PC2 are arranged in a region of the peripheral area PA located on the upper side of the display area DA.

The second sub-pixel circuit PC2 may be electrically connected to a third scan driving circuit SDRV3. Scan signals generated from the third scan driving circuit SDRV3 may be applied to the second sub-pixel circuit PC2 through a scan line electrically connected to the second sub-pixel circuit PC2. The second sub-pixel circuit PC2 may be electrically connected to one of data lines connected to the first sub-pixel circuit PC1 arranged in the first display area DA1, which is described below with reference to FIG. 9.

The third light-emitting diode ED3 is arranged in the third display area DA3. Light emitted from the third light-emitting diode ED3 may correspond to light of the third sub-pixel P3 (see FIG. 1) described above with reference to FIG. 1. A position of the third light-emitting diode ED3 may be a position of the third sub-pixel P3 (see FIG. 1). The third light-emitting diode ED3 may emit, for example, a red, a green, or a blue light. As described above with reference to FIG. 1, the resolution of the third display area DA3 may be the same as the resolution of the second display area DA2. In this case, the number of third light-emitting diodes ED3 per given area in the third display area DA3 may be the same as the number of second light-emitting diodes ED2 per given area of the same size in the second display area DA2. In another embodiment, the resolution of the third display area DA3 may be greater than the resolution of the second display area DA2 and less than the resolution of the first display area DA1. In this case, the number of third light-emitting diodes ED3 per given area in the third display area DA3 may be greater than the number of second light-emitting diodes ED2 per given area of the same size in the second display area DA2 and less than the number of first light-emitting diodes ED1 per given area of the same size in the first display area DA1.

The third sub-pixel circuit PC3 is arranged in the third display area DA3, the third sub-pixel circuit PC3 driving the third light-emitting diode ED3. The third sub-pixel circuit PC3 may be electrically connected to the third light-emitting diode ED3 and may operate the third light-emitting diode ED3.

The third sub-pixel circuit PC3 may be electrically connected to the first scan driving circuit SDRV1 and/or the second scan driving circuit SDRV2. The third sub-pixel circuit PC3 may share the first sub-pixel circuits PC1 arranged on the same row. As an example, the first scan driving circuit SDRV1 and/or the second scan driving circuit SDRV2 may apply scan signals to the first sub-pixel circuits PC1 and the third sub-pixel circuits PC3 arranged on the same row in the first direction through the scan line SL. The third sub-pixel circuit PC3 may be electrically connected to one of the data lines connected to the first sub-pixel circuit PC1 arranged in the first display area DA1, which is described below with reference to FIG. 9.

A dummy sub-pixel circuit PCd may be arranged in the third display area DA3. The dummy sub-pixel circuit PCd may be formed to reduce deviation of image qualities of the first to third display areas DA1, DA2, and DA3 while maintaining the continuity of lines (e.g., the scan line, the data line, and the like) shared by other pixel circuits (e.g., the first and second sub-pixel circuits PC1 and PC2).

Because the third display area DA3 is arranged between the peripheral area PA in which the second sub-pixel circuits PC2 are arranged and the second display area DA2, the conductive bus line CBL passes across (e.g., crosses) the third display area DA3, the conductive bus line CBL electrically connecting the second sub-pixel circuit PC2 to the second light-emitting diode ED2. The conductive bus line CBL may extend between two third sub-pixels PC3 adjacent to each other in the first direction (e.g., the x-direction) and/or extend beyond two dummy sub-pixel circuits PCd adjacent to each other in the first direction (e.g., the x-direction).

At least a portion of the conductive bus line CBL may include a transparent material. As an example, the conductive bus line CBL may include the first portion CBL1 and the second portion CBL2. The first portion CBL1 is electrically connected to the second light-emitting diode ED2 of the second display area DA2, and the second portion CBL2 is electrically connected to the second sub-pixel circuit PC2 of the peripheral area PA and passes across (e.g., crosses) the third display area DA3. The first portion CBL1 may include a transparent conducive material (TCO).

A driving voltage supply line 1100 and a common voltage supply line 1300 may be arranged in the peripheral area PA. The driving voltage supply line 1100 may be configured to apply a driving voltage to a sub-pixel circuit, for example, the first to third sub-pixel circuits PC1, PC2, and PC3. The common voltage supply line 1300 may be configured to apply a common voltage to a second electrode (a cathode) of a light-emitting diode, for example, the first to third light-emitting diodes ED1, ED2, and ED3.

The driving voltage supply line 1100 may be arranged between the pad PAD and one side of the display area DA. The common voltage supply line 1300 may have a loop shape having one open side and the other side partially surrounding the display area DA in a plan view.

Figure 4:
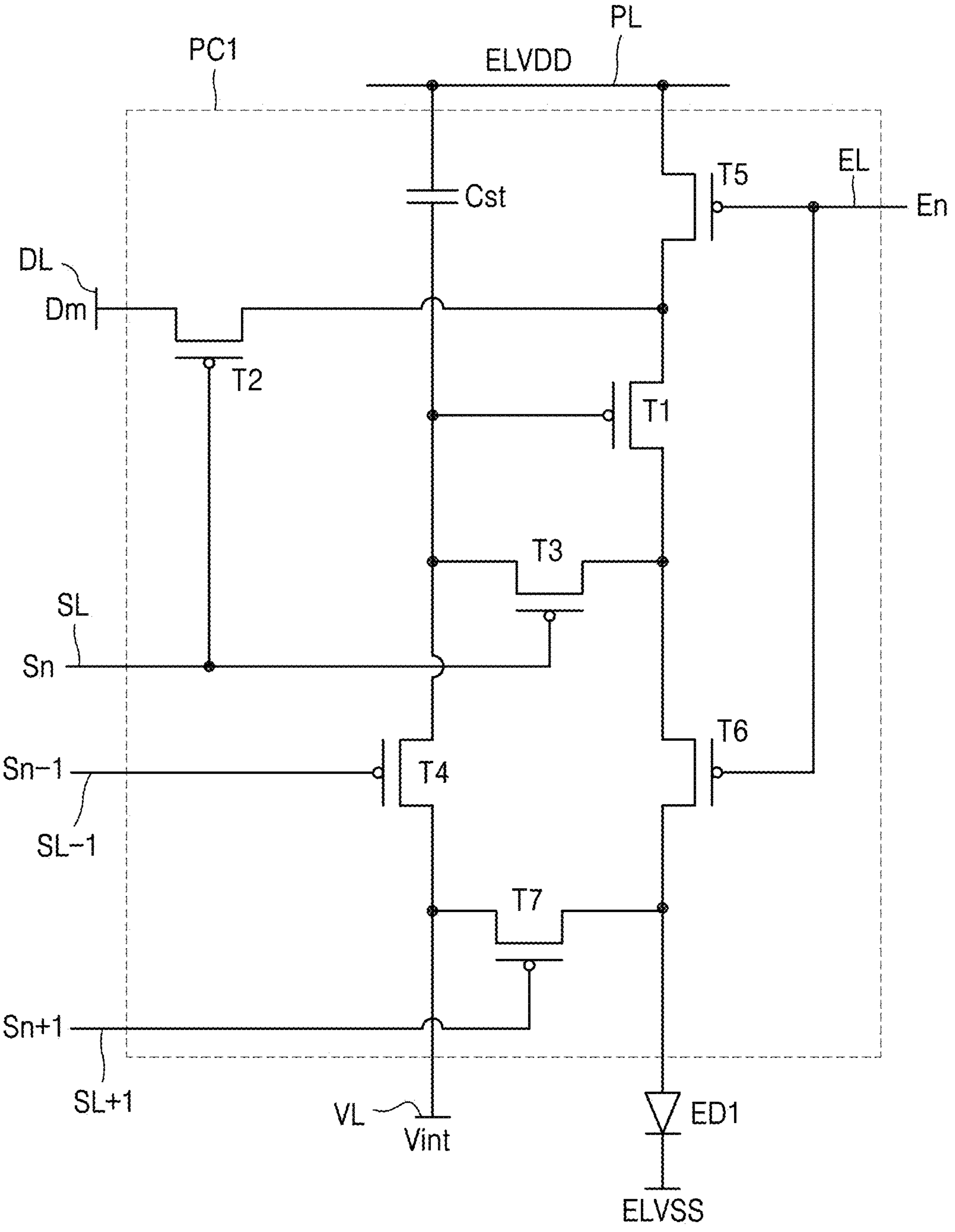
FIG. 4 is an equivalent circuit diagram of a first sub-pixel circuit electrically connected to a first light-emitting diode of a display panel, according to some embodiments.

FIG. 4 is an equivalent circuit diagram of a first sub-pixel circuit electrically connected to a first light-emitting diode of a display panel according to some embodiments.

Referring to FIG. 4, the first sub-pixel circuit PC1 may include a driving thin-film transistor T1, a switching thin-film transistor T2, a compensation thin-film transistor T3, a first initialization thin-film transistor T4, an operation control thin-film transistor T5, an emission control thin-film transistor T6, a second initialization thin-film transistor T7, and a storage capacitor Cst.

Although FIG. 4 shows that the first sub-pixel circuit PC1 includes signal lines SL, SL−1, SL+1, EL, and DL, an initialization voltage line VL, and a driving voltage line PL, the embodiment is not limited thereto. In other embodiments, at least one of the signal lines SL, SL−1, SL+1, EL, or DL, and/or the initialization voltage line VL may be shared by first sub-pixel circuits adjacent to each other.

A drain electrode of the driving thin-film transistor T1 may be electrically connected to the first light-emitting diode ED1 through the emission control thin-film transistor T6. The driving thin-film transistor T1 is configured to receive a data signal Dm according to a switching operation of the switching thin-film transistor T2 and supply a driving current to the first light-emitting diode ED1.

A gate electrode of the switching thin-film transistor T2 is connected to the scan line SL, and a source electrode of the switching thin-film transistor T2 is connected to the data line DL. A drain electrode of the switching thin-film transistor T2 may be connected to a source electrode of the driving thin-film transistor T1 and connected to the driving voltage line PL through the operation control thin-film transistor T5.

The switching thin-film transistor T2 is turned on according to a scan signal Sn transferred through the scan line SL and is configured to perform a switching operation of a data signal Dm to the source electrode of the driving thin-film transistor T1, the data signal Dm being transferred through the data line DL.

A gate electrode of the compensation thin-film transistor T3 may be connected to the scan line SL. A source electrode of the compensation thin-film transistor T3 may be connected to the drain electrode of the driving thin-film transistor T1 and connected to a pixel electrode of the first light-emitting diode ED1 through the emission control thin-film transistor T6. A drain electrode of the compensation thin-film transistor T3 may be connected to one of electrodes of the storage capacitor Cst, a source electrode of the first initialization thin-film transistor T4, and the gate electrode of the driving thin-film transistor T1, concurrently. The compensation thin-film transistor T3 is turned on according to a scan signal Sn transferred through the scan line SL and diode-connects the driving thin-film transistor T1 by connecting the gate electrode of the driving thin-film transistor T1 to the drain electrode of thin-film transistor T1.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be connected to one of the electrodes of the storage capacitor Cst, the drain electrode of the compensation thin-film transistor T3, and the gate electrode of the driving thin-film transistor T1, concurrently. The first initialization thin-film transistor T4 may be turned on according to a previous scan signal Sn−1 transferred through the previous scan line SL−1 and configured to perform an initialization operation of initializing the voltage of the gate electrode of the driving thin-film transistor T1 by transferring an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 is connected to the source electrode of the thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to a pixel electrode of the first light-emitting diode ED1. When the operation control thin-film transistor T5 and the emission control thin-film transistor T6 are concurrently turned on according to an emission control signal En transferred through the emission control line EL, a driving voltage ELVDD is transferred to the first light-emitting diode ED1 and the driving current flows through the first light-emitting diode ED1.

A gate electrode of the second initialization thin-film transistor T7 may be connected to a next scan line SL+1. A source electrode of the second initialization thin-film transistor T7 may be connected to the pixel electrode of the first light-emitting diode ED1. A drain electrode of the second initialization thin-film transistor T7 may be connected to the initialization voltage line VL. The second initialization thin-film transistor T7 may be turned on according to a next scan signal Sn+1 transferred through the next scan line SL+1 to initialize the pixel electrode of the first light-emitting diode ED1.

Although FIG. 4 shows that the first initialization thin-film transistor T4 and the second initialization thin-film transistor T7 are respectively connected to the previous scan line SL−1 and the next scan line SL+1, the embodiments are not limited thereto. In other embodiments, both the first initialization thin-film transistor T4 and the second initialization thin-film transistor T7 may be connected to a first scan line SLn−1 and driven according to a previous scan signal Sn−1.

One electrode of the storage capacitor Cst may be connected to the driving voltage line PL, and the other electrode of the storage capacitor Cst may be connected to the gate electrode of the driving thin-film transistor T1, the drain electrode of the compensation thin-film transistor T3, and the source electrode of the first initialization thin-film transistor T4, concurrently.

A second electrode (e.g., a cathode) of the first light-emitting diode ED1 receives the common voltage ELVSS. The first light-emitting diode ED1 emits light by receiving the driving current from the driving thin-film transistor T1.

In some embodiments, the first sub-pixel circuit PC1 is not limited to the number of thin-film transistors, the number of storage capacitors, and the circuit design described with reference to FIG. 4 and may vary.

Figure 5:
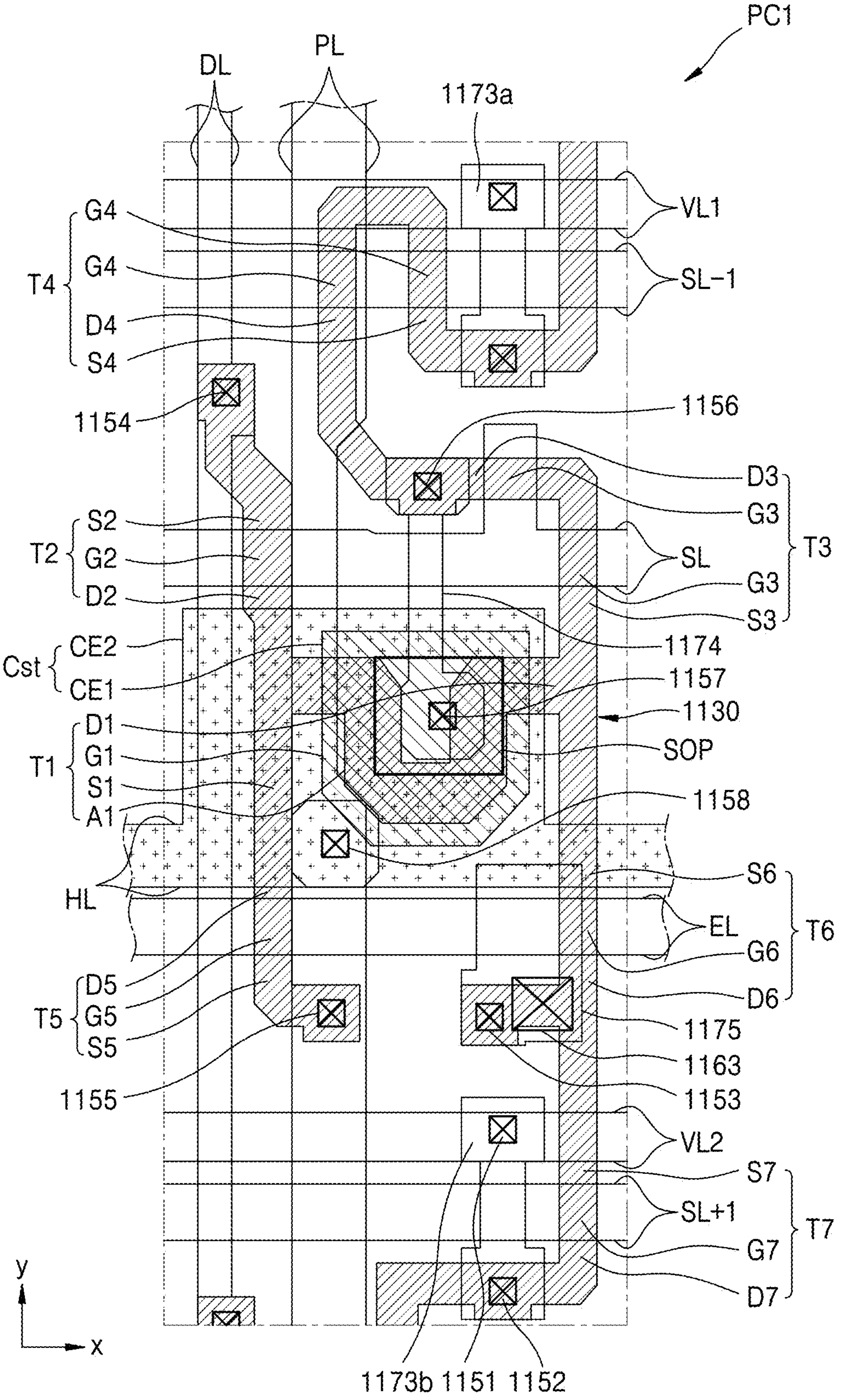
FIG. 5 is a plan view of a first sub-pixel circuit of a display panel, according to some embodiments.

FIG. 5 is a plan view of a first sub-pixel circuit of a display panel according to some embodiments.

Referring to FIG. 5, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are arranged along a semiconductor layer 1130. In some embodiments, the semiconductor layer 1130 is arranged over a substrate on which a buffer layer is formed, the buffer layer including an inorganic insulating material.

Some regions of the semiconductor layer 1130 correspond to semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. In other words, it may be understood that the semiconductor layers of the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 are connected to each other and bent in various shapes.

The semiconductor layer 1130 includes a channel region, a source region, and a drain region, the source region and the drain region being on two opposite sides of the channel region. The source region and the drain region may respectively correspond to a source electrode and a drain electrode of a relevant thin-film transistor. Hereinafter, for convenience of description, the source region and the drain region are respectively described as the source electrode and the drain electrode.

The driving thin-film transistor T1 includes a driving gate electrode G1, a driving source electrode S1, and a driving drain electrode D1, the driving gate electrode G1 overlapping a driving channel region, and the driving source electrode S1 and the driving drain electrode D1 being on two opposite sides of the driving channel region. The driving semiconductor layer A1, for example, the driving channel region overlapping the driving gate electrode G1, may form a relatively long channel length inside a relatively narrow space by including a bent shape such as a shape of the Greek letter for omega. In the case where the length of the driving channel region is relatively long, a driving range of a gate voltage is widened, and thus, a gray scale of light emitted from the first light-emitting diode ED1 may be more elaborately controlled and display quality may be improved.

The switching thin-film transistor T2 includes a switching gate electrode G2, a switching source electrode S2, and a switching drain electrode D2, the switching gate electrode G2 overlapping a switching channel region, and the switching source electrode S2 and the switching drain electrode D2 being on two opposite sides of the switching channel region. The switching drain electrode D2 may be connected to the driving source electrode S1.

The compensation thin-film transistor T2 may be a dual thin-film transistor and may include compensation gate electrodes G3, compensation source electrodes S3, and compensation drain electrodes D3, the compensation gate electrodes G3 overlapping two compensation channel regions, and the compensation source electrodes S3 and the compensation drain electrodes D3 being on two opposite sides of the compensation channel regions. The compensation thin-film transistor T3 may be connected to the driving gate electrode G1 of the driving thin-film transistor T1 through a node connection line 1174 described below.

The first initialization thin-film transistor T4 may be a dual thin-film transistor and may include first initialization gate electrodes G4, first initialization source electrodes S4, and first initialization drain electrodes D4, the first initialization gate electrodes G4 overlapping two first initialization channel regions, and the first initialization source electrodes S4 and the first initialization drain electrodes D4 being on two opposite sides of the first initialization channel regions.

The operation control thin-film transistor T5 may include an operation control gate electrode G5, an operation control source electrode S5, and an operation control drain electrode D5, the operation control gate electrode G5 overlapping an operation control channel region, and the operation control source electrode S5 and the operation control drain electrode D5 being on two opposite sides of the operation control channel region. The operation control drain electrode D5 may be connected to the driving source electrode S1.

The emission control thin-film transistor T6 may include an emission control gate electrode G6, an emission control source electrode S6, and an emission control drain electrode D6, the emission control gate electrode G6 overlapping an emission control channel region, and the emission control source electrode S6 and the emission control drain electrode D6 being on two opposite sides of the emission control channel region. The emission control source electrode S6 may be connected to the driving drain electrode D1.

The second initialization thin-film transistor T7 may include a second initialization gate electrode G7, a second initialization source electrode S7, and a second initialization drain electrode D7, the second initialization gate electrode G7 overlapping a second initialization channel region, and the second initialization source electrode S7 and the second initialization drain electrode D7 being on two opposite sides of the second initialization channel region.

The above thin-film transistors may be connected to the signal lines SL, SL−1, SL+1, EL, and DL, initialization voltage lines VL1 and VL2, and the driving voltage line PL.

The scan line SL, the previous scan line SL−1, the emission control line EL, and the driving gate electrode G1 may be arranged over the semiconductor layer 1130 with an insulating layer(s) therebetween.

The scan line SL may extend in the first direction (e.g., the x-direction). Regions of the scan line SL may correspond to the switching and compensation gate electrodes G2 and G3. As an example, regions of the scan line SL overlapping the channel regions of the switching and compensation thin-film transistors T2 and T3 may be the switching and compensation gate electrodes G2 and G3, respectively.

The previous scan line SL−1 may extend in the first direction (e.g., the x-direction) and some regions thereof may correspond to the first initialization gate electrodes G4, respectively. As an example, regions of the previous scan lines SL−1 overlapping the channel regions of the first initialization thin-film transistor T4 may be the first initialization gate electrodes G4, respectively.

The next scan line SL+1 may extend in the first direction (e.g., the x-direction) and some regions thereof may correspond to the second initialization gate electrode G7. As an example, regions of the next scan line SL+1 overlapping channel regions of the second initialization thin-film transistor T7 may be the second initialization gate electrode G7.

The emission control line EL extends in the first direction (e.g., the x-direction). Regions of the emission control line EL may correspond to the operation control and emission control gate electrodes G5 and G6, respectively. As an example, regions of the emission control line EL overlapping the channel regions of the operation control and emission control thin-film transistors T6 and T7 may be the operation control and emission control gate electrodes G5 and G6, respectively.

The driving gate electrode G1 is a floating electrode and may be connected to the compensation thin-film transistor T3 through the node connection line 1174.

An electrode voltage line HL may be arranged over the previous scan line SL−1, the scan line SL, the next scan line SL+1, the emission control line EL, and the driving gate electrode G1 with an insulating layer(s) therebetween.

The electrode voltage line HL may extend in the first direction (e.g., the x-direction) to cross the data line DL and the driving voltage line PL. A portion of the electrode voltage line HL may cover at least a portion of the driving gate electrode G1 and constitute the storage capacitor Cst in cooperation with the driving gate electrode G1. As an example, the driving gate electrode G1 may serve as a lower electrode CE1 of the storage capacitor Cst, and a portion of the electrode voltage line HL may serve as an upper electrode CE2 of the storage capacitor Cst.

The upper electrode CE2 of the storage capacitor Cst is electrically connected to the driving voltage line PL. Accordingly, the electrode voltage line HL may be connected to the driving voltage line PL through a contact hole CNT, the driving voltage line PL being on the electrode voltage line HL. Accordingly, the electrode voltage line HL may have the same voltage level (e.g., a constant voltage) as that of the driving voltage line PL. As an example, the electrode voltage line HL may have a constant voltage of about +5 V. In some embodiments, the electrode voltage line HL is a transversal driving voltage line.

In some embodiments, because the driving voltage line PL extends in the second direction (e.g., the y-direction) and the electrode voltage line HL electrically connected to the driving voltage line PL extends in the first direction (the x-direction) crossing the second direction (the y-direction), a plurality of driving voltage lines PL and a plurality of electrode voltage lines HL may constitute a mesh structure in the display area DA.

The data line DL, the driving voltage line PL, initialization connection lines 1173*a* and 1173*b*, and the node connection line 1174 may be arranged over the electrode voltage line HL with an insulating layer(s) therebetween.

The data line DL extends in the second direction (the y-direction) and may be connected to the switching source electrode S2 of the switching thin-film transistor T2 through a contact hole 1154. In some embodiments, a portion of the data line DL is the switching source electrode.

The driving voltage line PL extends in the second direction (the y-direction) and is connected to the electrode voltage line HL through a contact hole CNT as described above. In addition, the driving voltage line PL may be connected to the operation control thin-film transistor T5 through a contact hole 1155. The driving voltage line PL may be connected to the operation control drain electrode D5 through the contact hole 1155.

The first initialization voltage line VL1 may be connected to the first initialization thin-film transistor T4 through the first initialization connection line 1173*a*, and the second initialization voltage line VL2 may be connected to the second initialization thin-film transistor T7 through the second initialization connection line 1173*b*. The first initialization voltage line VL1 may be electrically connected to the second initialization voltage line VL2 by a connection member and may have a constant voltage (e.g., −2 V).

One end of the node connection line 1174 may be connected to the compensation drain electrode D3 through a contact hole 1156, and another end may be connected to the driving gate electrode G1 through a contact hole 1157. The upper electrode CE2 includes a storage opening SOP, and the contact hole 1157 may be arranged inside the storage opening SOP.

The initialization voltage line VL may be arranged over the data line DL, the driving voltage line PL, the initialization connection line 1173, and the node connection line 1174 with an insulating layer(s) therebetween.

The initialization voltage lines, that is, the first and second initialization voltage lines VL1 and VL2 may be arranged on the same layer as the pixel electrode of the first light-emitting diode ED1 and may include the same material as that of the pixel electrode. The pixel electrode may be connected to the emission control thin-film transistor T6. The pixel electrode may be connected to the connection electrode CM through a contact hole 1163, and the connection electrode CM may be connected to the emission control drain electrode D6 through a contact hole 1153. In other embodiments, the initialization voltage lines, that is, the first and second initialization voltage lines VL1 and VL2, may be arranged on the same layer as the electrode voltage line HL.

Figure 6:
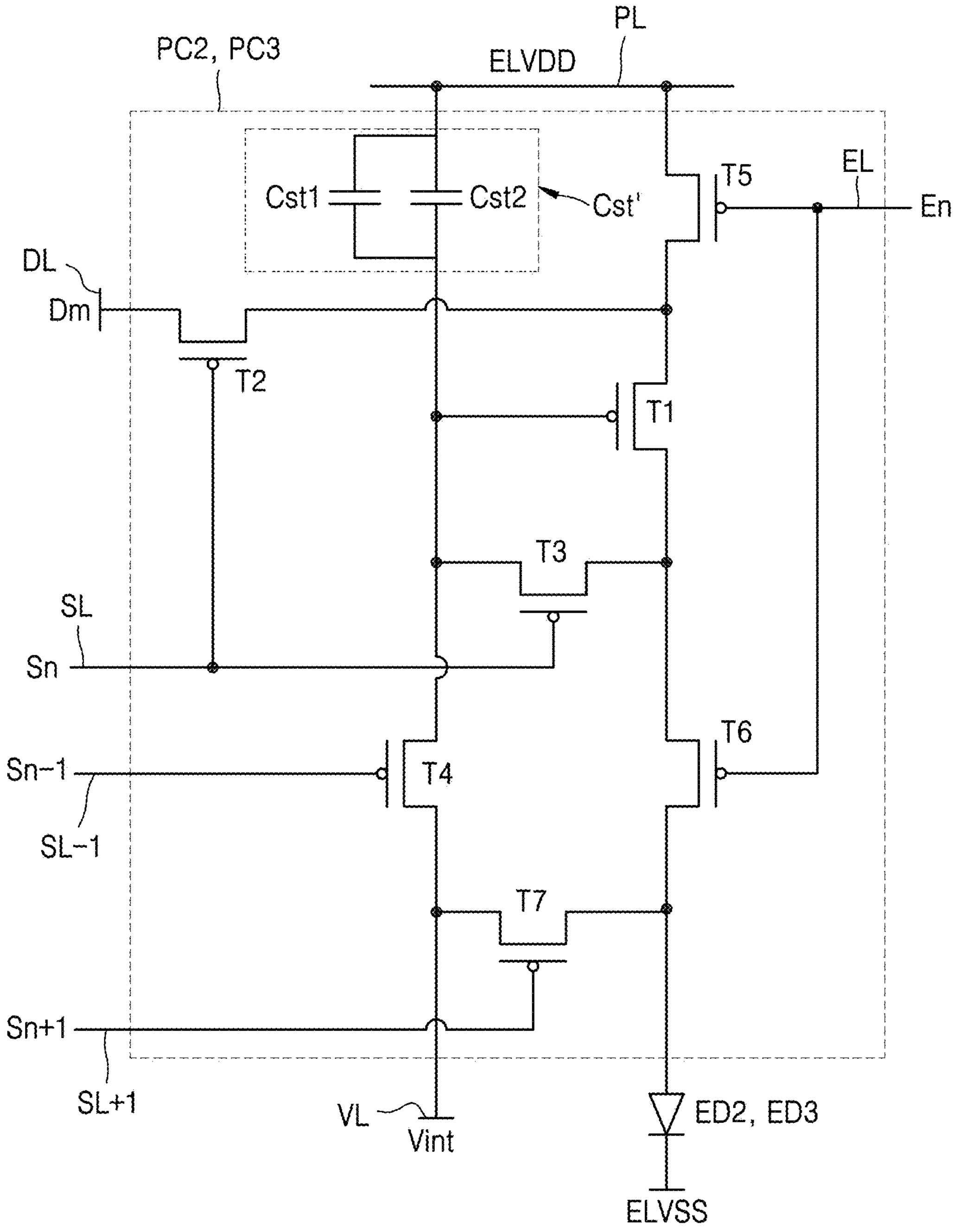
FIG. 6 is an equivalent circuit diagram of a second sub-pixel circuit and a third sub-pixel circuit of a display panel, according to some embodiments.

FIG. 6 is an equivalent circuit diagram of a second sub-pixel circuit and a third sub-pixel circuit of a display panel according to some embodiments.

Referring to FIG. 6, the second sub-pixel circuit PC2 and the third sub-pixel circuit PC3 may be respectively electrically connected to the second light-emitting diode ED2 and the third light-emitting diode ED3. Like the first sub-pixel circuit PC1 of FIG. 4, the second sub-pixel circuit PC2 and the third sub-pixel circuit PC3 may each include the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7.

The second sub-pixel circuit PC2 and the third sub-pixel circuit PC3 may each include a storage capacitor Cst' having a larger capacity than that of the storage capacitor Cst of the first sub-pixel circuit PC1 of FIG. 4. The storage capacitor Cst' of each of the second sub-pixel circuit PC2 and the third sub-pixel circuit PC3 may include a first storage capacitor Cst1 and a second storage capacitor Cst2 parallel-connected to each other. Because the second sub-pixel circuit PC2 and the third sub-pixel circuit PC3 includes the additional second storage capacitor Cst2, the capacity of the storage capacitor Cst' of each of the second sub-pixel circuit PC2 and the third sub-pixel circuit PC3 may be greater than the capacity of the storage capacitor Cst of the first sub-pixel circuit PC1.

The connection relationship of the thin-film transistors shown in FIG. 6, that is, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7 included in each of the second sub-pixel circuit PC2 and the third sub-pixel circuit PC3, is the same as the connection relationship of the first sub-pixel circuit PC1. Therefore, the descriptions thereof are the same as those described above with reference to FIG. 5 and will not be repeated here.

Figure 7:
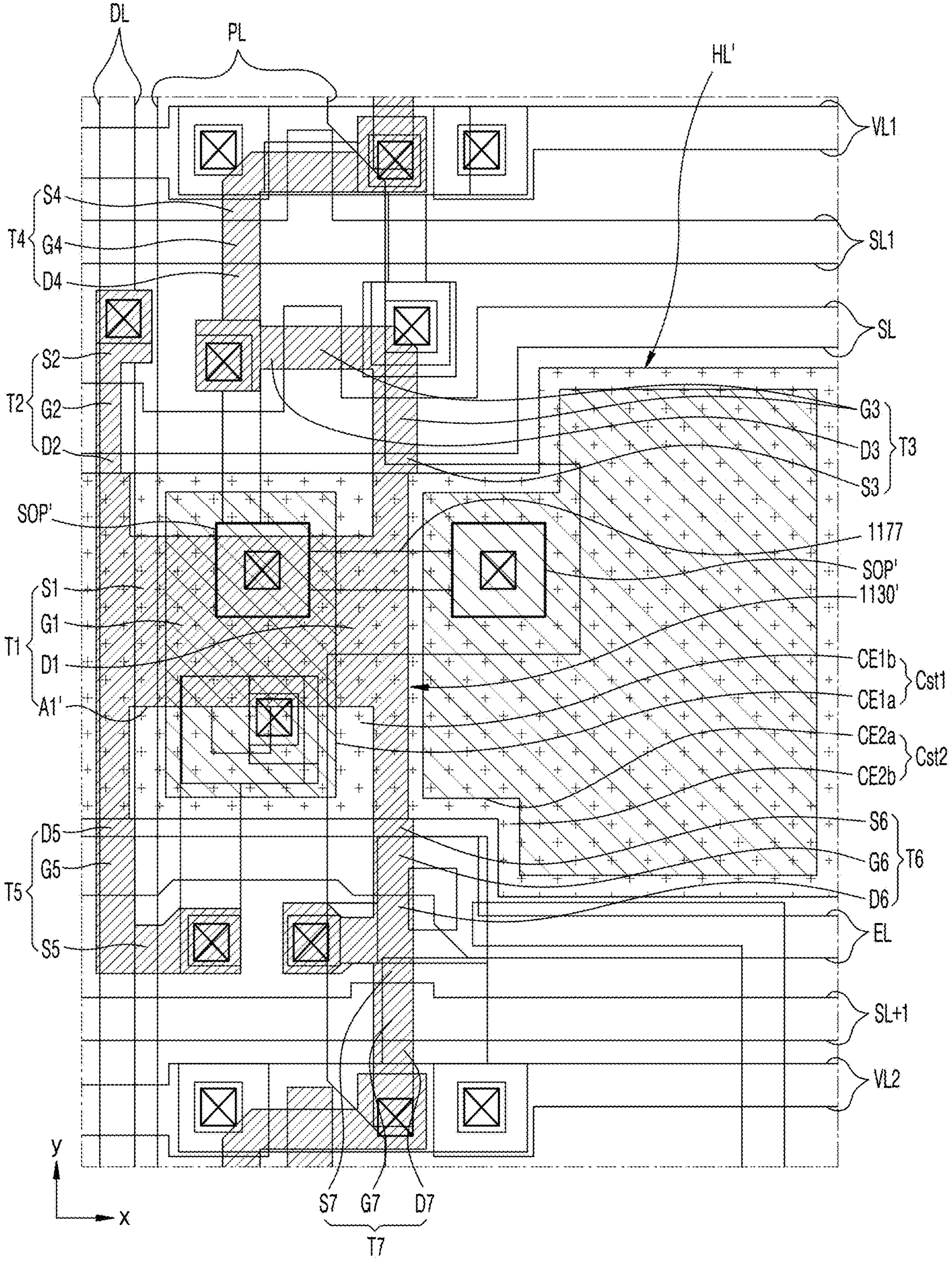
FIG. 7 is a plan view of a second sub-pixel circuit and a third sub-pixel circuit of a display panel, according to some embodiments.

FIG. 7 is a plan view of the second sub-pixel circuit PC2 and the third sub-pixel circuit PC3 of the display panel according to some embodiments.

Referring to FIG. 7, like the first sub-pixel circuit PC1 of FIG. 5, the second sub-pixel circuit PC2 and the third sub-pixel circuit PC3 may each include the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7. The thin-film transistors, that is, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7, of each of the second sub-pixel circuit PC2 and the third sub-pixel circuit PC3 may have the same connection relationship and same characteristics of the thin-film transistors, that is, the driving thin-film transistor T1, the switching thin-film transistor T2, the compensation thin-film transistor T3, the first initialization thin-film transistor T4, the operation control thin-film transistor T5, the emission control thin-film transistor T6, and the second initialization thin-film transistor T7, of the first sub-pixel circuit PC1. Therefore, in FIG. 7, the descriptions of the same elements as those of FIG. 5 are omitted and the differences are described below.

The shape of a semiconductor layer of the driving thin-film transistor T1 of each of the second sub-pixel circuit PC2 and the third sub-pixel circuit PC3 may be different from the shape of the semiconductor layer of the driving thin-film transistor T1 of the first sub-pixel circuit PC1. The shape of the semiconductor layer of the driving thin-film transistor T1 of the first sub-pixel circuit PC1 may have a structure that is bent one or more times, such as the shape of the Greek letter for omega. In contrast, as shown in FIG. 7, a channel region of a driving semiconductor layer A1' of the driving thin-film transistor T1 of each of the second sub-pixel circuit PC2 and the third sub-pixel circuit PC3, for example, a partial region of the driving semiconductor layer A1' overlapping the driving gate electrode G1 may have a bar shape. In another embodiment, the channel region of a driving semiconductor layer A1' of the driving thin-film transistor T1 of each of the second sub-pixel circuit PC2 and the third sub-pixel circuit PC3 may have a shape that is bent a plurality of times (e.g., in the shape of the Greek letter for omega) as in the first sub-pixel circuit PC1.

Each of the second sub-pixel circuit PC2 and the third sub-pixel circuit PC3 may have a storage capacitor Cst' larger than that of the first sub-pixel circuit PC1 of FIG. 5. The storage capacitor Cst' of each of the second sub-pixel circuit PC2 and the third sub-pixel circuit PC3 may include the first storage capacitor Cst1 and the second storage capacitor Cst2, the first storage capacitor Cst1 overlapping the driving thin-film transistor T1, and the second storage capacitor Cst2 being electrically connected to the first storage capacitor Cst1.

The first storage capacitor Cst1 may include a first lower electrode CE1*a* and a first upper electrode CE1*b* overlapping the first lower electrode CE1*a*. The first lower electrode CE1*a* may include the driving gate electrode G1 of the driving thin-film transistor T1.

The second storage capacitor Cst2 may include a second lower electrode CE2*a* and a second upper electrode CE2*b*, the second lower electrode CE2*a* being electrically connected to the first lower electrode CE1*a* through a connection line 1177, and the second upper electrode CE2*b* overlapping the second lower electrode CE2*a*. An overlapping area of the second lower electrode CE2*a* and the second upper electrode CE2*b* may be greater than an overlapping area of the first lower electrode CE1*a* and the first upper electrode CE1*b*.

In some embodiments, the second storage capacitor Cst2 may not overlap a transistor. As an example, because an undesired signal may occur when the second lower electrode CE2*a* overlaps a semiconductor layer 1130', the second lower electrode CE2*a* does not overlap the semiconductor layer 1130' and a thin-film transistor formed along the semiconductor layer 1130'.

As shown in FIG. 5, the driving voltage line PL shown in FIG. 7 may extend in the second direction (e.g., the y-direction) and form a mesh structure in cooperation with an electrode voltage line HL' extending in the first direction (e.g., the x-direction), and the electrode voltage line HL' may include a first upper electrode CE1*b* and a second upper electrode CE2*b*. A first portion of the electrode voltage line HL' extending in the first direction (e.g., the x-direction) across the display area DA (see FIG. 3) may include the first upper electrode CE1*b*, and a second portion of the electrode voltage line HL' may include the second upper electrode CE2*b*. In other words, the first upper electrode CE1*b* and the second upper electrode CE2*b* may be formed as one body.

The electrode voltage line HL' has a single closed curve and includes two openings SOP' respectively overlapping the first lower electrode CE1*a* and the second lower electrode CE2*a*. Two opposite ends of the connection line 1177 may be respectively connected to the first lower electrode CE1*a* and the second lower electrode CE2*a* through the two openings SOP'.

Figure 8:
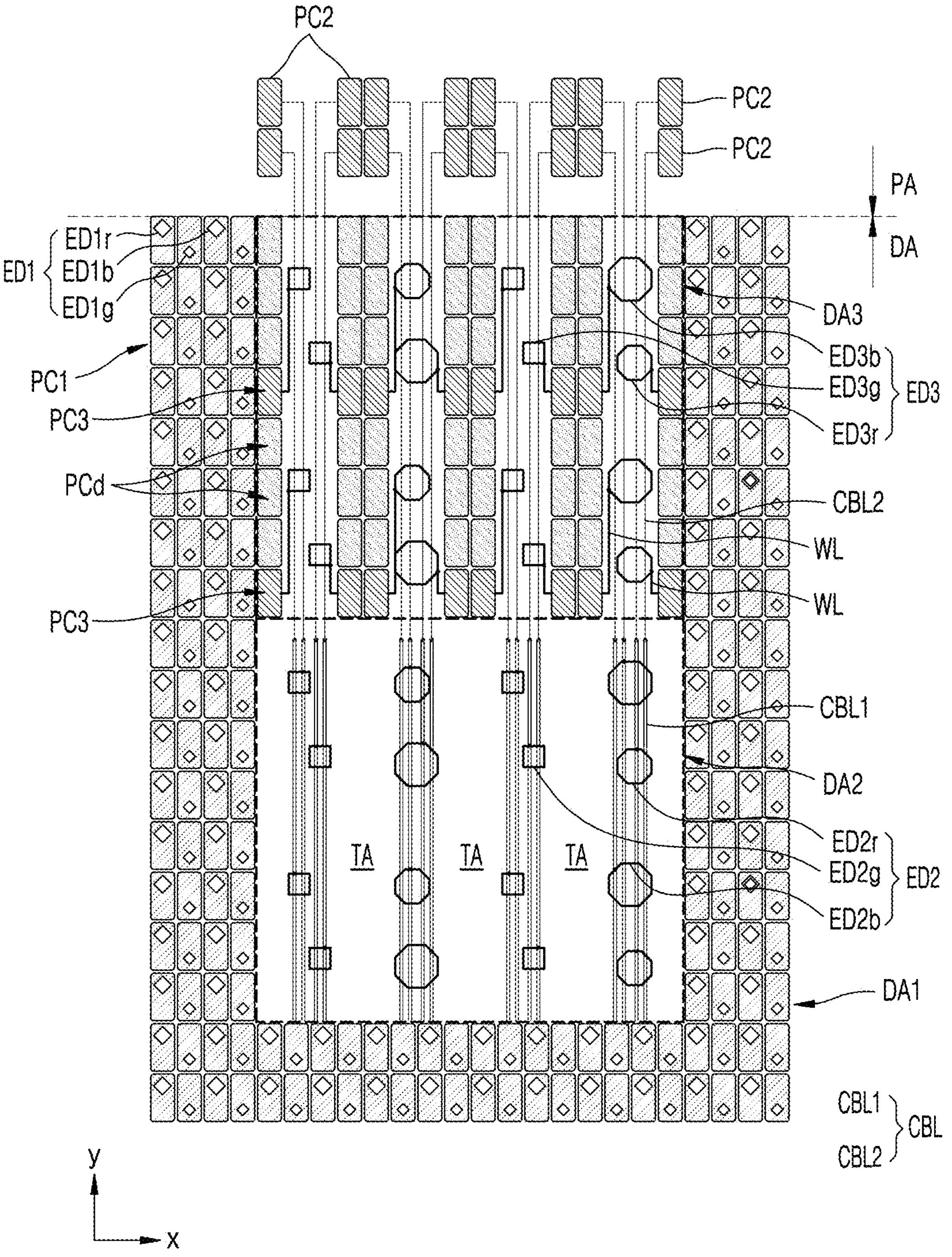
FIG. 8 is a plan view of a portion of a display panel according to some embodiments.

FIG. 8 is a plan view of a portion of a display panel according to some embodiments. FIG. 8 shows the configuration of the first to third sub-pixel circuits PC1, PC2, and PC3, and the first to third light-emitting diodes ED1, ED2, and ED3.

Referring to FIG. 8, the first light-emitting diodes ED1 may be arranged in the first display area DA1. The first light-emitting diodes ED1 may include a first red light-emitting diode ED1*r*, a first green light-emitting diode ED1g, and a first blue light-emitting diode ED1*b*. Because the first sub-pixel P1 (see FIG. 1) described above with reference to FIG. 1 corresponds to an emission area in which light is emitted from the first light-emitting diode ED1, an emission area of the first red light-emitting diode ED1*r* corresponds to a first red sub-pixel, an emission area of the first green light-emitting diode ED1*g* corresponds to a first green sub-pixel, and an emission area of the first blue light-emitting diode ED1*b* corresponds to a first blue sub-pixel. The positions of the first red light-emitting diode ED1*r*, the first green light-emitting diode ED1*g*, and the first blue light-emitting diode ED1*b* may respectively correspond to the first red sub-pixel, the first green sub-pixel, and the first blue sub-pixel.

The first red sub-pixel, the first green sub-pixel, and the first blue sub-pixel (e.g., the first red light-emitting diode ED1*r*, the first green light-emitting diode ED1*g*, and the first blue light-emitting diode ED1*b*) may be arranged in various ways. As an example, as shown in FIG. 8, the first red sub-pixel, the first green sub-pixel, and the first blue sub-pixel (e.g., the first red light-emitting diode ED1*r*, the first green light-emitting diode ED1*g*, and the first blue light-emitting diode ED1*b*) may be arranged in an RGBG matrix structure (e.g., in a PENTILE™ scheme). PENTILE™ is a registered trademark of Samsung Display Co., Ltd., Republic of Korea.

As an example, two first red sub-pixels (e.g., the first red light-emitting diodes ED1*r*) may be arranged in a diagonal direction among vertices of a virtual quadrangle with the first green sub-pixel (e.g., the first green light-emitting diode ED1*g*) centered, and the first blue sub-pixels (e.g., the first blue light-emitting diodes ED1*b*) may be arranged at the other two vertices. A relatively high resolution may be implemented through this configuration. In other embodiments, the first red sub-pixel, the first green sub-pixel, and the first blue sub-pixel may be arranged in various configurations such as a stripe type, a mosaic configuration type, a delta configuration type, and the like.

The first sub-pixel circuits PC1 may be arranged in the first display area DA1. The first sub-pixel circuits PC1 may form rows and columns, for example, in the x-direction and the y-direction and be arranged in a matrix configuration. A structure of the first sub-pixel circuit PC1 corresponds to that described with reference to FIG. 5.

The second light-emitting diodes ED2 may be arranged in the second display area DA2. The second light-emitting diodes ED2 may include a second red light-emitting diode ED2*r*, a second green light-emitting diode ED2*g*, and a second blue light-emitting diode ED2*b*. Because the second sub-pixel P2 (see FIG. 1) described above with reference to FIG. 1 corresponds to an emission area in which light is emitted from the second light-emitting diode ED2, an emission area of the second red light-emitting diode ED2*r* corresponds to a second red sub-pixel, an emission area of the second green light-emitting diode ED2*g* corresponds to a second green sub-pixel, and an emission area of the second blue light-emitting diode ED2*b* corresponds to a second blue sub-pixel. The positions of the second red light-emitting diode ED2*r*, the second green light-emitting diode ED2*g*, and the second blue light-emitting diode ED2*b* may respectively correspond to the second red sub-pixel, the second green sub-pixel, and the second blue sub-pixel.

The second red sub-pixel, the second green sub-pixel, and the second blue sub-pixel (e.g., the second red light-emitting diode ED2*r*, the second green light-emitting diode ED2*g*, and the second blue light-emitting diode ED2*b*) may be arranged in various ways. As an example, the second red sub-pixel, the second green sub-pixel, and the second blue sub-pixel (e.g., the second red light-emitting diode ED2*r*, the second green light-emitting diode ED2*g*, and the second blue light-emitting diode ED2*b*) may be arranged in various ways such as in an RGBG matrix structure type (e.g., in a PENTILE™ scheme), a stripe type, a mosaic configuration type, a delta configuration type, and the like. PENTILE™ is a registered trademark of Samsung Display Co., Ltd., Republic of Korea.

The second sub-pixels (e.g., the second light-emitting diodes ED2) may be dispersed inside the second display area DA2. As an example, a distance between the second sub-pixels may be greater than a distance between the first sub-pixels. Accordingly, a distance between the second light-emitting diodes ED2 adjacent to each other may be greater than a distance between the first light-emitting diodes ED1 adjacent to each other. A region of the second display area DA2 in which the second light-emitting diodes ED2 are not arranged may correspond to the transmission area TA having a high light transmittance.

The resolutions of the second red sub-pixel, the second green sub-pixel, and the second blue sub-pixel may be different from the resolutions of the first red sub-pixel, the first green sub-pixel, and the first blue sub-pixel. As an example, the number of second red light-emitting diodes ED2*r*, the number of second green light-emitting diodes ED2*g*, and the number of second blue light-emitting diodes ED2*b* per a given area in the second display area DA2 may be less than the number of first red light-emitting diodes ED1*r*, the number of first green light-emitting diodes ED1*g*, and the number of first blue light-emitting diodes ED1*b* per a given area of the same size in the first display area DA1.

The second sub-pixel circuits PC2 may be arranged in the peripheral area PA and may not overlap the second light-emitting diodes ED2. Because the second sub-pixel circuits PC2 are not arranged in the second display area DA2, the second display area DA2 may provide for a wider transmission area TA. In addition, because lines (e.g., the scan line, the data line, the driving voltage line, the initialization voltage line, and the like) configured to apply voltages and/or signals to the second sub-pixel circuit PC2 are not arranged in the second display area DA2, the second sub-pixels, for example, the second light-emitting diodes ED2 may be arranged more freely.

For the second sub-pixel circuits PC2 arranged in the peripheral area PA to drive the second light-emitting diodes ED2 arranged in the second display area DA2, the second sub-pixel circuits PC2 may be connected to the second light-emitting diodes ED2 through the conductive bus lines CBL. A structure of the second sub-pixel circuit PC2 is the same as that described with reference to FIG. 7 and will not be repeated here.

The conductive bus line CBL may extend toward the second display area DA2 beyond the third display area DA3 while being electrically connected to the second sub-pixel circuit PC2. One end of the conductive bus line CBL is arranged in the peripheral area PA (e.g., a portion of the peripheral area PA adjacent to the third display area DA3) and another end is arranged in the second display area DA2.

At least a portion of the conductive bus line CBL may include a transparent conductive material. A portion (referred to as a first portion CBL1, hereinafter) of the conductive bus line CBL arranged in the second display area DA2 may include a transparent conductive oxide (TCO). As an example, the first portion CBL1 may include a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO). Accordingly, the reduction of light transmittance through the transmission area TA may be reduced. In other words, the transmittance of light through the transmission area TA may be improved (e.g., increased).

In some embodiments, a portion (referred to as a second portion CBL2, hereinafter) of the conductive bus line CBL arranged in the peripheral area PA and the third display area DA3 may include an opaque material. As an example, the second portion CBL2 may include a material having a higher conductivity than that of the TCO. The second portion CBL2 may include a conductive material such as molybdenum (Mo), aluminum (Al), copper (Cu), and titanium (Ti) and include a multi-layer or a single layer including the above materials. As an example, the second portion CBL2 may have a multi-layered structure such as, Ti/Al/Ti.

The third light-emitting diodes ED3 may be arranged in the third display area DA3 and may include a third red light-emitting diode ED3*r*, a third green light-emitting diode ED3*g*, and a third blue light-emitting diode ED3*b*. Because the third sub-pixel P3 (see FIG. 1) described above with reference to FIG. 1 corresponds to an emission area in which light is emitted from the third light-emitting diode ED3, an emission area of the third red light-emitting diode ED3*r* corresponds to a third red sub-pixel, an emission area of the third green light-emitting diode ED3*g* corresponds to a third green sub-pixel, and an emission area of the third blue light-emitting diode ED3*b* corresponds to a third blue sub-pixel. The positions of the third red light-emitting diode ED3*r*, the third green light-emitting diode ED3*g*, and the third blue light-emitting diode ED3*b* may respectively correspond to the third red sub-pixel, the third green sub-pixel, and the third blue sub-pixel.

The third red sub-pixel, the third green sub-pixel, and the third blue sub-pixel (e.g., the third red light-emitting diode ED3*r*, the third green light-emitting diode ED3*g*, and the third blue light-emitting diode ED3*b*) may be arranged in various ways. As an example, the third red sub-pixel, the third green sub-pixel, and the third blue sub-pixel (e.g., the third red light-emitting diode ED3*r*, the third green light-emitting diode ED3*g*, and the third blue light-emitting diode ED3*b*) may be arranged in various ways such as an RGBG matrix structure type (e.g., in a PENTILE™ scheme), a stripe type, a mosaic configuration type, a delta configuration type, and the like. PENTILE™ is a registered trademark of Samsung Display Co., Ltd., Republic of Korea.

The third sub-pixels (e.g., the third light-emitting diodes ED3) may be dispersed inside the third display area DA3. As an example, a distance between the third sub-pixels may be greater than a distance between the first sub-pixels. Accordingly, a distance between the third light-emitting diodes ED3 adjacent to each other may be greater than a distance between the first light-emitting diodes ED1.

It is shown in FIG. 8 that the configuration of the third sub-pixels (e.g., the third light-emitting diodes ED3) is substantially the same as the configuration of the second sub-pixels (e.g., the second light-emitting diodes ED2). In some embodiments, the number of third red light-emitting diodes ED3*r*, the number of third green light-emitting diodes ED3*g*, and the number of third blue light-emitting diodes ED3*b* per a given area in the third display area DA3 may be substantially the same as the number of second red light-emitting diodes ED2*r*, the number of second green light-emitting diodes ED2*g*, and the number of second blue light-emitting diodes ED2*b* per a given area of the same size in the second display area DA2. In other embodiments, the number of third red light-emitting diodes ED3*r*, the number of third green light-emitting diodes ED3*g*, and the number of third blue light-emitting diodes ED3*b* per a given area in the third display area DA3 may be greater than the number of second red light-emitting diodes ED2*r*, the number of second green light-emitting diodes ED2*g*, and the number of second blue light-emitting diodes ED2*b* per a given area of the same size in the second display area DA2.

The third sub-pixel circuits PC3 may be arranged in the third display area DA3. The dummy sub-pixel circuits PCd may be further arranged in the third display area DA3. The third sub-pixel circuits PC3 and the dummy sub-pixel circuits PCd may be arranged to form rows and columns.

A structure of the third sub-pixel circuit PC3 is the same as that described with reference to FIG. 7 and will not be repeated here. The dummy sub-pixel circuits PCd may maintain the continuity of a process of forming the third sub-pixel circuit PC3 and the continuity of a line providing signals or voltages, and thus, reduce deviation of image quality for each region of the display panel. The dummy sub-pixel circuits PCd may have the same planar shape as that of the third sub-pixel circuit PC3. As an example, the dummy sub-pixel circuits PCd may have the structure described with reference to FIG. 7.

A separation distance between two third sub-pixel circuits PC3 adjacent to each other in the first direction (e.g., the x-direction) may be greater than a separation distance between first sub-pixel circuits PC1 adjacent to each other in the first direction (e.g., the x-direction). The conductive bus line CBL may extend in the second direction (e.g., the y-direction) between two third sub-pixel circuits PC3 adjacent to each other and apart from each other.

The third sub-pixel circuit PC3 may be spaced apart from the third light-emitting diode ED3 electrically connected to the third sub-pixel circuit PC3. The third sub-pixel circuit PC3 may be electrically connected to the third light-emitting diode ED3 through a wiring WL. In a plan view of FIG. 8, one of two third sub-pixel circuits PC3 arranged on two opposite sides of the conductive bus line CBL is one of the third light-emitting diode ED3 through the wiring WL, and the other third sub-pixel circuit PC3 may be connected to the other third light-emitting diode ED3 through the wiring WL. In this case, the wirings WL may extend in parallel to the conductive bus lines CBL and, like the conductive bus lines CBL, the wirings WL may be arranged between the third sub-pixel circuits PC3 that are spaced apart from each other.

Figure 9:
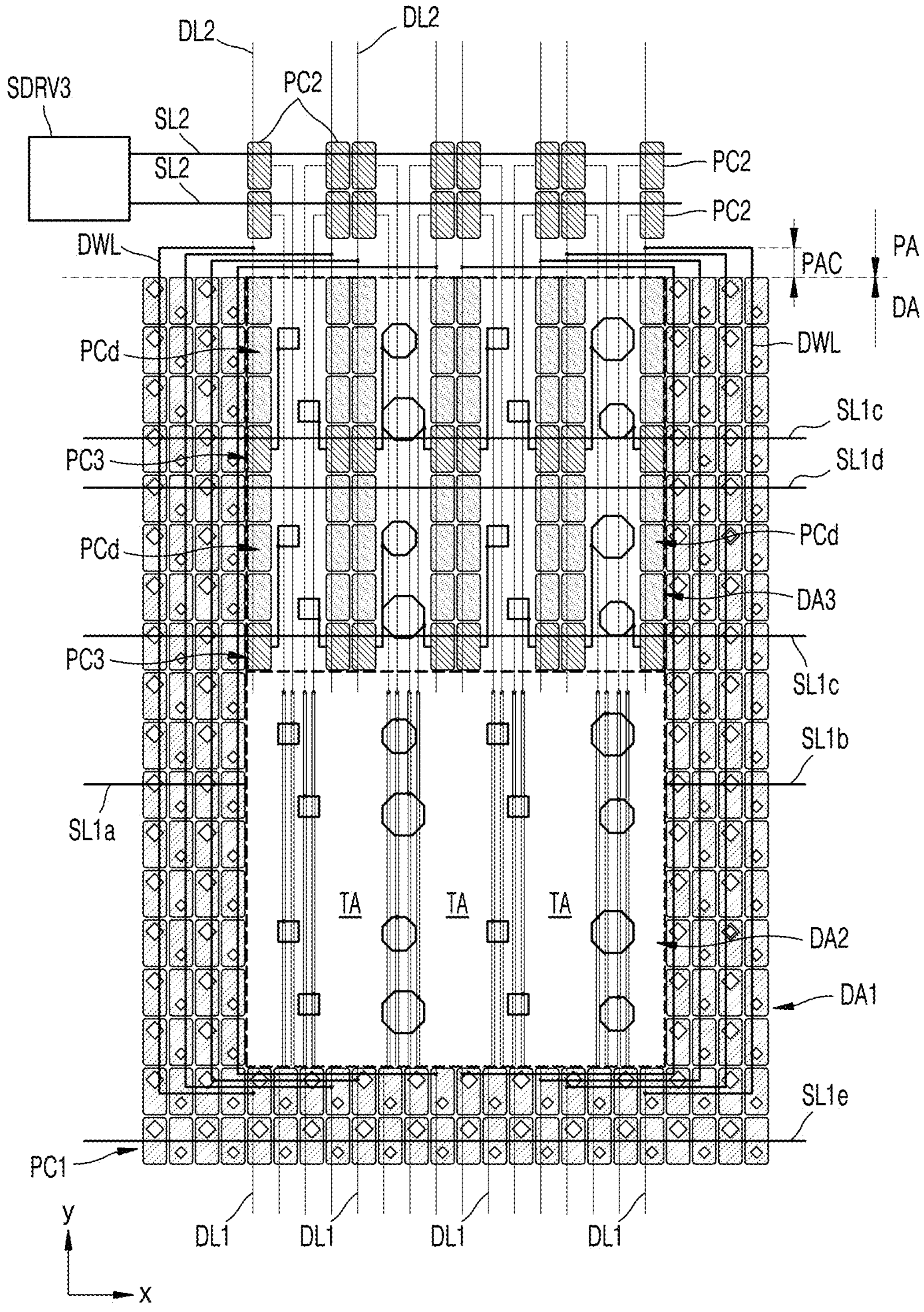
FIG. 9 is a plan view of a portion of a display panel according to some embodiments and shows signal lines connected to first to third sub-pixel circuits.

FIG. 9 is a plan view of a portion of a display panel according to some embodiments and shows signal lines connected to the first to third sub-pixel circuits PC1, PC2, and PC3. For convenience of description, FIG. 9 omits the first to third light-emitting diodes ED1, ED2, and ED3 described with reference to FIG. 8.

Referring to FIG. 9, scan lines arranged in the display area DA may extend in the first direction (e.g., the x-direction) and may be electrically connected to pixel circuits on the same row. Because the second display area DA2 includes the transmission area TA, some scan lines may be separated from each other around the second display area DA2.

The first sub-pixel circuits PC1 arranged on two opposite sides of the second display area DA2 in the first display area DA1 may be electrically connected to different scan lines. As an example, the first sub-pixel circuits PC1 arranged to the left of the second display area DA2 and arranged on the same row may be electrically connected to a scan line (referred to as a first scan line SL a, hereinafter) arranged to the left of the second display area DA2. In contrast, the first sub-pixel circuits PC1 arranged to the right of the second display area DA2 in the first display area DA1 and arranged on the same row may be electrically connected to a scan line (referred to as a first scan line SL b, hereinafter) arranged to the right of the second display area DA2.

The first scan line SL a is separated and spaced apart from the second scan line SL b with the second display area DA2 therebetween. The first scan line SL a may be electrically connected to the first scan driving circuit SDRV1 (see FIG. 3) described above with reference to FIG. 3, and the second scan line SL b may be electrically connected to the second scan driving circuit SDRV2 (see FIG. 3).

The first sub-pixel circuits PC1 and the third sub-pixel circuits PC3 on the same row may be connected to the same scan line. Accordingly, FIG. 8 shows that the first sub-pixel circuits PC1 and the third sub-pixel circuits PC3 on the same row may be electrically connected to a scan line (referred to as a third scan line SL1*c*, hereinafter). The third scan line SL1*c* may pass across (e.g., cross) the first display area DA1 and the third display area DA3.

Similarly, the first sub-pixel circuits PC1 and the dummy sub-pixel circuits PCd on the same row may be connected to the same scan line. As an example, the first sub-pixel circuits PC1 and the dummy sub-pixel circuits PCd on the same row may be electrically connected to a scan line (referred to as a fourth scan line SL1*d*). The fourth scan line SL1*d* may pass across (e.g., cross) the first display area DA1 and the third display area DA3.

A scan line (referred to as a fifth scan line SL1*e*, hereinafter) passing across (e.g., crossing) only the first display area DA1 may be electrically connected to the first sub-pixel circuits PC1 on the same row and may provide scan signals. With regard to this, it is shown that the fifth scan line SL1*e* arranged below the second display area DA2 of the display area DA and arranged on the same row is electrically connected to the first sub-pixel circuits PC1 successively arranged along the same row.

The second sub-pixel circuits PC2 arranged in the peripheral area PA and arranged on the same row may be connected to the same scan line. Accordingly, FIG. 8 shows a scan line (referred to as a sixth scan line SL2, hereinafter) passing across (e.g., crossing) the peripheral area PA. Unlike the first to fifth scan lines SL1*a*, SL2*b*, SLc, SLd, and SLe passing across (e.g., crossing) the display area DA receiving signals from the first scan driving circuit SDRV1 or the second scan driving circuit SDRV2, the sixth scan line SL2 may receive signals from the third scan driving circuit SDRV3.

The data lines may extend in the second direction (e.g. the y-direction) and be electrically connected to the pixel circuits on the same column. Because the second display area DA2 includes the transmission area TA, some data lines may be separated from each other around the second display area DA2.

The data lines may include a first data line DL1 and a second data line DL2. The first data line DL1 is electrically connected to the first sub-pixel circuits PC1, and the second data line DL2 is electrically connected to the second sub-pixel circuits PC2 and the third sub-pixel circuits PC3. The first data line DL1 passes across (e.g., crosses) the first display area DA1. In contrast, the second data line DL2 may pass across (e.g., cross) the third display area DA3 and the peripheral area PA.

The first data line DL1 may extend in the second direction (e.g., the y-direction) and be connected to the first sub-pixel circuits PC1 on the same column. The second data line DL2 may extend in the second direction (e.g., the y-direction) and be connected to the second sub-pixel circuits PC2, the third sub-pixel circuits PC3, and the dummy sub-pixel circuits PCd on the same column.

The first data line DL1 may be spaced apart and separated from the second data line DL2 with the second display area DA2 therebetween. The first data line DL1 may be connected to the second data line DL2 through a data connection line DWL. Accordingly, the same signal may be applied to the first sub-pixel circuit PC1, the second sub-pixel circuit PC2, and the third sub-pixel circuit PC3 on the same column.

The data connection line DWL may be arranged to detour the second display area DA2. The data connection line DWL may be electrically connected to the first data line DL1 in the first display area DA1 and electrically connected to the second data line DL2 in a connection region PAC of the peripheral area PA that is most adjacent to the third display area DA3. The connection region PAC may be arranged between a group of the third sub-pixel circuit PC3 and the dummy sub-pixel circuits PCd arranged in the third display area DA3, and a group of the second sub-pixel circuits PC2 arranged in the peripheral area PA.

The data connection line DWL may be arranged in a layer different from the first data line DL1 and the second data line DL2 and connected to the first data line DL1 and the second data line DL2 through contact holes.

Figure 10:
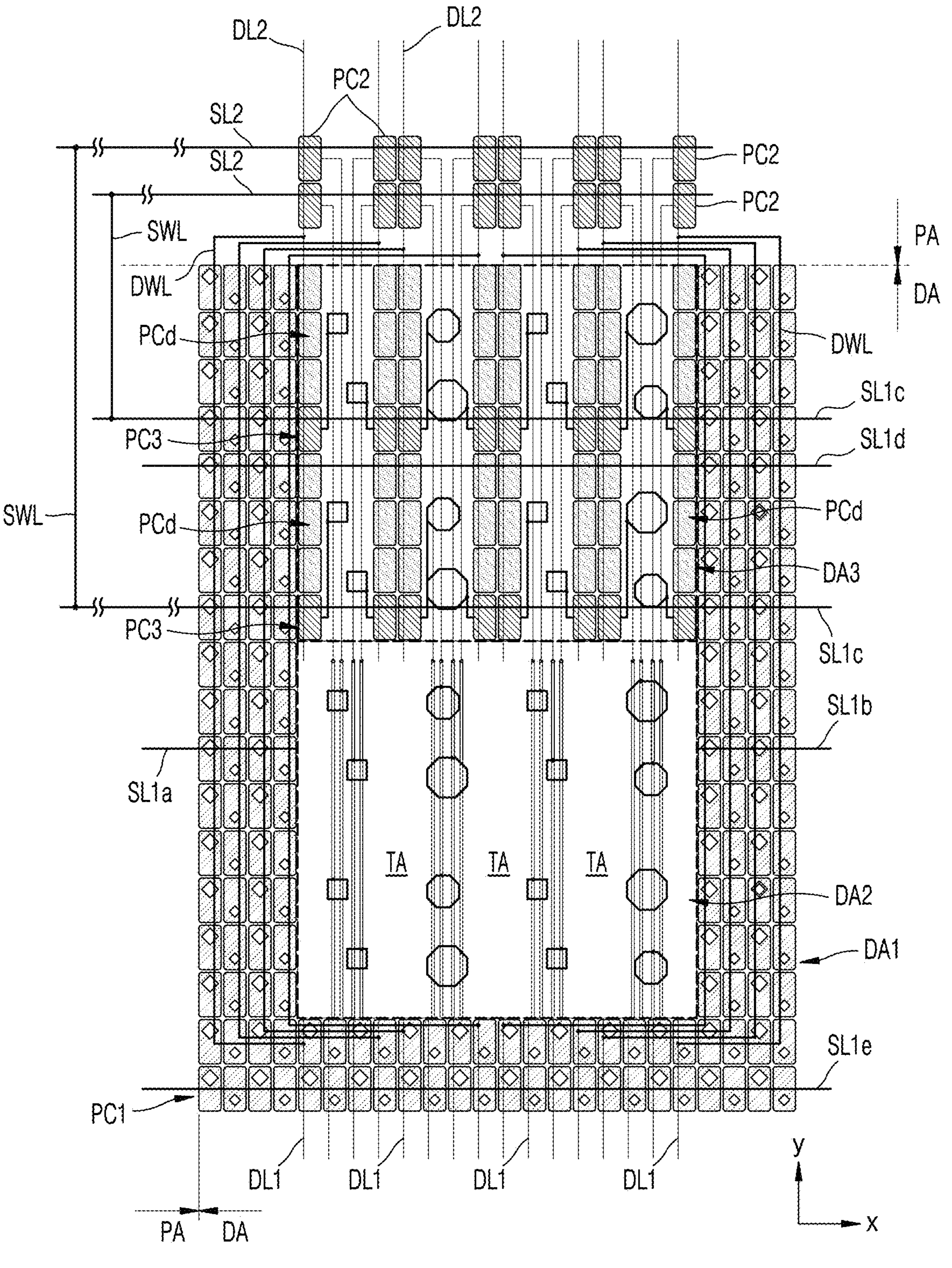
FIG. 10 is a plan view of a portion of a display panel according to other embodiments and shows signal lines connected to first to third sub-pixel circuits.

FIG. 10 is a plan view of a portion of a display panel according to other embodiments and shows signal lines connected to the first to third sub-pixel circuits PC1, PC2, and PC3. For convenience of description, FIG. 10 omits the reference of first to third light-emitting diodes ED1, ED2, and ED3 described with reference to FIG. 8.

Referring to FIG. 10, the structure of the data lines is the same as that described above with reference to FIG. 9. The scan line includes the first to fifth scan lines SL1*a*, SL b, SL c, SL1*d*, and SL1*e* passing across (e.g., crossing) the display area DA and the structures thereof are the same as those described above with reference to FIG. 9. In the embodiment described above with reference to FIG. 9, the third scan driving circuit SDRV3 configured to transfer signals to the sixth scan line SL2 passing across (e.g., crossing) the peripheral area PA is provided. In contrast, in the embodiment shown in FIG. 10, the display panel may not include the third scan driving circuit SDRV3.

Referring to FIG. 10, the sixth scan line SL2 connected to the second sub-pixel circuits PC2 on the same row in the peripheral area PA may be electrically connected to the scan line passing across (e.g., crossing) the display area DA by a scan connection line SWL. Accordingly, FIG. 10 shows that the sixth scan line SL2 is connected to the third scan line SL c by the scan connection line SWL. The scan connection line SWL may be arranged in the peripheral area PA.

Figure 11:
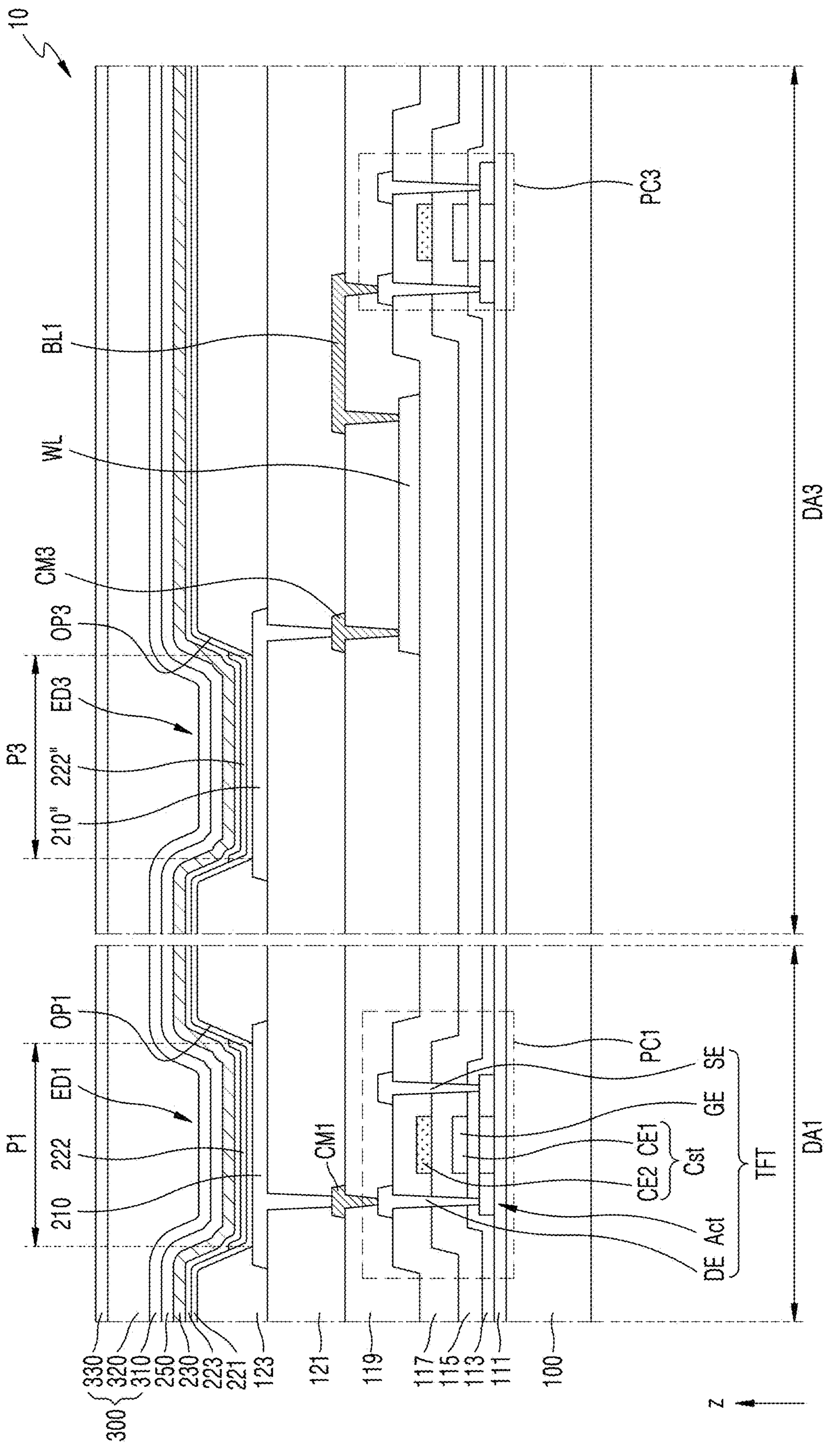
FIG. 11 is a cross-sectional view of a first sub-pixel circuit, a first light-emitting diode, a third sub-pixel circuit, and a second light-emitting diode of a display panel, according to some embodiments.

FIG. 11 is a cross-sectional view of the first sub-pixel circuit PC1, the first light-emitting diode ED1, the third sub-pixel circuit PC3, and the third light-emitting diode ED3 of a display panel according to some embodiments.

Referring to the first display area DA1 of FIG. 11, the first sub-pixel circuit PC1 and the first light-emitting diode ED1 are arranged over the substrate 100.

The substrate 100 may include an insulating material such as glass, quartz, and a polymer resin. The substrate 100 may be a rigid substrate or a flexible substrate that is bendable, foldable, and/or rollable.

A buffer layer 111 may be arranged on the substrate 100, may reduce (e.g., prevent) foreign substance or moisture from below the substrate 100 from penetrating into the thin-film transistor TFT, and provide a flat surface on the substrate 100. The buffer layer 111 may include an inorganic material such as oxide or nitride, an organic material, or an organic/inorganic composite material and include a single-layered structure or a multi-layered structure including the inorganic material and the organic material. A barrier layer may be further included between the substrate 100 and the buffer layer 111, the barrier layer blocking the penetration of external air. In some embodiments, the buffer layer 111 may include silicon oxide, silicon oxynitride, or silicon nitride.

The first sub-pixel circuit PC1 may be arranged on the buffer layer 111, the first sub-pixel circuit PC1 including the thin-film transistor TFT and the storage capacitor Cst. The thin-film transistor TFT may include a semiconductor layer Act, a gate electrode GE, a source electrode SE, and a drain electrode DE.

The semiconductor layer Act may be arranged on the buffer layer 111 and may include polycrystalline silicon. In another embodiment, the semiconductor layer Act may include an amorphous silicon. In another embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), or zinc (Zn). The semiconductor layer Act may include a channel region, a source region, and a drain region, the source region and the drain region being doped with impurities.

A gate insulating layer 113 may be arranged on the semiconductor layer Act. The gate insulating layer 113 may include an inorganic insulating material such as silicon oxide, silicon oxynitride, and silicon nitride. The gate insulating layer 113 may include a single layer or a multi-layer including the above inorganic insulating materials.

The gate electrode GE is arranged over the gate insulating layer 113 to overlap the semiconductor layer Act. The gate electrode GE may include at least one of molybdenum (Mo), aluminum (Al), copper (Cu), and/or titanium (Ti) or include a multi-layer or a single layer including the above materials. As an example, the gate electrode GE may be a single Mo layer.

A first interlayer insulating layer 115 may be arranged on the gate electrode GE. The first interlayer insulating layer 115 may include an inorganic insulating material such as silicon oxide, silicon oxynitride, and silicon nitride. The first interlayer insulating layer 115 may include a single layer or a multi-layer including the above inorganic insulating materials.

The upper electrode CE2 of the storage capacitor Cst may be arranged on the first interlayer insulating layer 115. The upper electrode CE2 of the storage capacitor Cst may overlap the lower electrode CE1 therebelow. In some embodiments, the thin-film transistor TFT of FIG. 11 may be the same as the driving thin-film transistor described above with reference to FIG. 5. In this case, the lower electrode CE1 may include the gate electrode GE. The planar shape of the first sub-pixel circuit PC1 of FIG. 11 is the same as that described above with reference to FIG. 5.

The upper electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

A second interlayer insulating layer 117 may be arranged on the upper electrode CE2. The second interlayer insulating layer 117 may include an inorganic insulating material such as silicon oxide, silicon oxynitride, and silicon nitride. The second interlayer insulating layer 117 may include a single layer or a multi-layer including the above inorganic insulating materials.

The source electrode SE and the drain electrode DE may be arranged on the second interlayer insulating layer 117. The source electrode SE and the drain electrode DE may include a conductive material including molybdenum (Mo), aluminum (Al), copper (Cu), and titanium (Ti) and have a single-layered structure or a multi-layered structure including the above materials. As an example, the source electrode SE and the drain electrode DE may have a multi-layered structure such as, Ti/Al/Ti.

A first organic insulating layer 119 may be arranged on the source electrode SE and the drain electrode DE.

The first organic insulating layer 119 may include an organic insulating material such as photosensitive polyimide or a siloxane-based organic material.

A first contact metal CM1 may be arranged on the first organic insulating layer 119 and may be electrically connected to the first sub-pixel circuit PC1. The first contact metal CM1 may include a metal material including molybdenum (Mo), aluminum (Al), copper (Cu), and/or titanium (Ti) and have a single-layered structure or a multi-layered structure including the above materials.

A second organic insulating layer 121 may be arranged on the first organic insulating layer 119. The second organic insulating layer 121 may include an organic insulating material such as photosensitive polyimide or a siloxane-based organic material.

The first light-emitting diode ED1 may be arranged on the second organic insulating layer 121. A first electrode 210 of the first light-emitting diode ED1 may be connected to the first contact metal CM1 through a via hole of the second organic insulating layer 121 and electrically connected to the first sub-pixel circuit PC1 by the medium of the first contact metal CM1.

The first light-emitting diode ED1 may include the first electrode 210, an emission layer 222, and a second electrode 230 and may further include a functional layer between the first electrode 210 and the second electrode 230.

The first electrode 210 of the first light-emitting diode ED1 may include a conductive oxide such as indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO). The first electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As an example, the first electrode 210 may have a structure having layers including ITO, IZO, ZnO, or $In_2O_3$ on (e.g., above or below) the reflective layer. The first electrode 210 may have a stack structure of ITO/Ag/ITO.

A bank layer 123 may be arranged on the second organic insulating layer 121 and may cover the edges of the first electrode 210 of the first light-emitting diode ED1. The bank layer 123 may include a first opening OP1 that exposes the central portion of the first electrode 210. The first opening OP1 of the bank layer 123 may correspond to an emission area of the first light-emitting diode ED1, that is, the first sub-pixel P1. In other words, the size and shape of the first sub-pixel P1 may be defined by the size and shape of the first opening OP1.

The bank layer 123 may include an organic insulating material such as polyimide, polyamide, an acrylic resin, benzocyclobutene, hexamethyldisiloxane (HMDSO), and a phenolic resin.

The emission layer 222 may be arranged over the bank layer 123. The emission layer 222 may include a polymer material or a low molecular weight material and emit red, green, or blue light. First and second functional layers 221 and 223 may be arranged on (e.g., below and above, respectively) the emission layer 222. The first functional layer 221 may include a hole transport layer (HTL) and/or a hole injection layer (HIL). The second functional layer 223 may include an electron transport layer (ETL) and/or an electron injection layer (EIL). Unlike the emission layer 222, the first and second functional layers 221 and 223 may cover the display area entirely.

The second electrode 230 may include a conductive material having a low work function. Unlike the emission layer 222, the second electrode 230 may cover the display area entirely. The second electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the second electrode 230 may further include a layer on the (semi) transparent layer, the layer including ITO, IZO, ZnO, or $In_2O_3$.

Referring to the third display area DA3 of FIG. 11, the third sub-pixel circuit PC3 and the third light-emitting diode ED3 are arranged over the substrate 100. The third sub-pixel circuit PC3 may include a thin-film transistor and a storage capacitor. The materials thereof may be the same as those of the first sub-pixel circuit PC1 of FIG. 11 and will not be repeated here. The planar shape of the third sub-pixel circuit PC3 is the same as that described with reference to FIG. 7 and will also not be repeated here.

The third sub-pixel circuit PC3 may be electrically connected to the third light-emitting diode ED3 through the wiring WL. In some embodiments, as shown in FIG. 11, the third sub-pixel circuit PC3 may be connected to the wiring WL through a first bridge line BL1. The wiring WL may be electrically connected to a first electrode 210" of the third light-emitting diode ED3 through a third contact metal CM3.

In some embodiments, the wiring WL may be arranged on the second interlayer insulating layer 117. The first bridge line BL1 and the third contact metal CM3 may be arranged on the first organic insulating layer 119. The wiring WL may include the same material as that of the source electrode SE or the drain electrode DE of the thin-film transistor TFT. The first bridge line BL1 and the third contact metal CM3 may each include the same material as that of the first contact metal CM1.

Although FIG. 11 shows that the wiring WL is arranged on the second interlayer insulating layer 117, the embodiment is not limited thereto. In another embodiment, the wiring WL may be arranged on the first organic insulating layer 119. In this case, the wiring WL, the first bridge line BL1, and the third contact metal CM3 on the first organic insulating layer 119 may be formed as one body. In other words, one end of a wiring on the first organic insulating layer 119 may be connected to the thin-film transistor of the third sub-pixel circuit PC3, and another end may be connected to the first electrode 210" of the third light-emitting diode ED3.

The third light-emitting diode ED3 may include the first electrode 210", an emission layer 222", and the second electrode 230 and further includes the first and second functional layers 221 and 223 between the first electrode 210" and the second electrode 230.

The first electrode 210" of the third light-emitting diode ED3 may include the same material as that of the first electrode 210 of the first light-emitting diode ED1. The edges of the first electrode 210" of the third light-emitting diode ED3 are covered by the bank layer 123. The bank layer 123 includes a third opening OP3 overlapping the central portion of the first electrode 210" of the third light-emitting diode ED3. The third opening OP3 of the bank layer 123 may correspond to an emission area of the third light-emitting diode ED3, that is, the third sub-pixel P3. In other words, the size and shape of the third opening OP3 may be defined by the size and shape of the third sub-pixel P3.

The emission layer 222" of the third light-emitting diode ED3 may include a polymer organic material or a low molecular weight organic material that may emit red, green, or blue light. As described above, the second electrode 230 may be formed as one body to cover the display area entirely.

A capping layer 250 may be arranged on the second electrode 230, may increase a light extraction efficiency and concurrently protect the second electrode 230. The capping layer 250 may be formed on the substrate 100 to cover the display area entirely. The capping layer 250 may include an organic material. Alternatively, the capping layer 250 may include lithium fluoride (LiF). Alternatively, the capping layer 250 may include an inorganic insulating material such as silicon oxide and silicon nitride.

The encapsulation layer 300 may include at least one inorganic encapsulation layer and at least one organic encapsulation layer. In some embodiments, the encapsulation layer 300 may include a first inorganic encapsulation layer 131, a second inorganic encapsulation layer 133, and an organic encapsulation layer 132 therebetween.

The first inorganic encapsulation layer 131 and the second inorganic encapsulation layer 133 may include at least one inorganic insulating material such as silicon oxide, silicon nitride, and silicon oxynitride. The organic encapsulation layer 132 may include a polymer-based material. The polymer-based material may include a silicon-based resin, an acryl-based resin, an epoxy-based resin, polyimide, and polyethylene. The first inorganic encapsulation layer 131, the organic encapsulation layer 132, and the second inorganic encapsulation layer 133 may each cover the display area entirely.

In some embodiments, the input sensing layer, the optical functional layer, the cover window, and the like described above with reference to FIG. 2 may be further arranged on the encapsulation layer 300.

Figure 12:
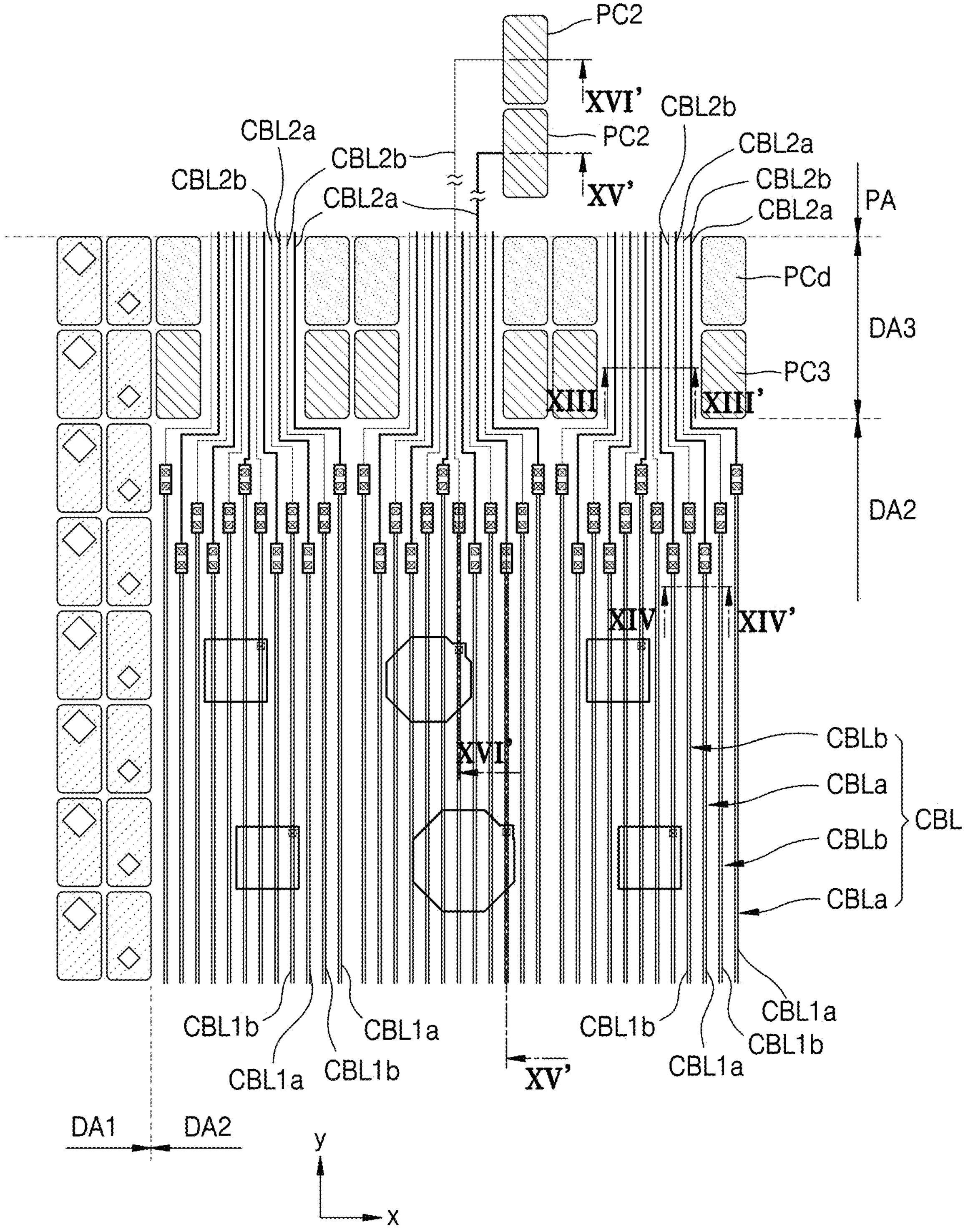
FIG. 12 is a plan view of a portion of a display panel according to some embodiments.

FIG. 12 is a plan view of a portion of a display panel according to some embodiments. As described above with reference to FIG. 8, referring to FIG. 12, the third sub-pixel circuit PC3 and the dummy sub-pixel circuit PCd may be arranged in the third display area DA3, the second sub-pixel circuit PC2 may be arranged in the peripheral area PA, and the first sub-pixel circuit PC1 may be arranged in the first display area DA1. For convenience of description, the third light-emitting diode ED3 arranged in the third display area DA3 is omitted in FIG. 12.

The third sub-pixel circuits PC3 may be arranged to form the same row in the first direction (e.g., the x-direction), and the dummy pixel-circuits PCd may be arranged to form the same row. The third sub-pixel circuits PC3 and the dummy pixel-circuits PCd may be arranged to form the same column in the second direction (e.g., the y-direction).

The conductive bus lines CBL may pass through a space between an N-th column of the third sub-pixel circuit PC3 and the dummy sub-pixel circuit PCd, and an (n+1)-th column of the third sub-pixel circuit PC3 and the dummy sub-pixel circuit PCd, wherein the conductive bus lines CBL electrically connect the second sub-pixel circuits PC2 to the second light-emitting diodes ED2.

The conductive bus lines CBL may include a first conductive bus line CBLa and a second conductive bus line CBLb adjacent to each other. The first conductive bus line CBLa and the second conductive bus line CBLb may be alternatingly arranged in the first direction (e.g., the x-direction).

The first conductive bus line CBLa may include a first portion CBL1*a* and a second portion CBL2*a*, the first portion CBL1*a* passing across (e.g., crossing) the second display area DA2, and the second portion CBL2*a* passing across (e.g., crossing) the third display area DA3 and the peripheral area PA. The first portion CBL1*a* of the first conductive bus line CBLa may be electrically connected to the second portion CBL2*a* on one side of the second display area DA2, for example, at a portion of the second display area DA2 adjacent to the third display area DA3.

The second conductive bus line CBLb may include a first portion CBL1*b* and a second portion CBL2*b*, the first portion CBL1*b* passing across (e.g., crossing) the second display area DA2, and the second portion CBL2*b* passing across (e.g., crossing) the third display area DA3 and the peripheral area PA. The first portion CBL1*b* of the second conductive bus line CBLb may be electrically connected to the second portion CBL2*b* on one side of the second display area DA2, for example, at a portion of the second display area DA2 adjacent to the third display area DA3.

Figure 13:
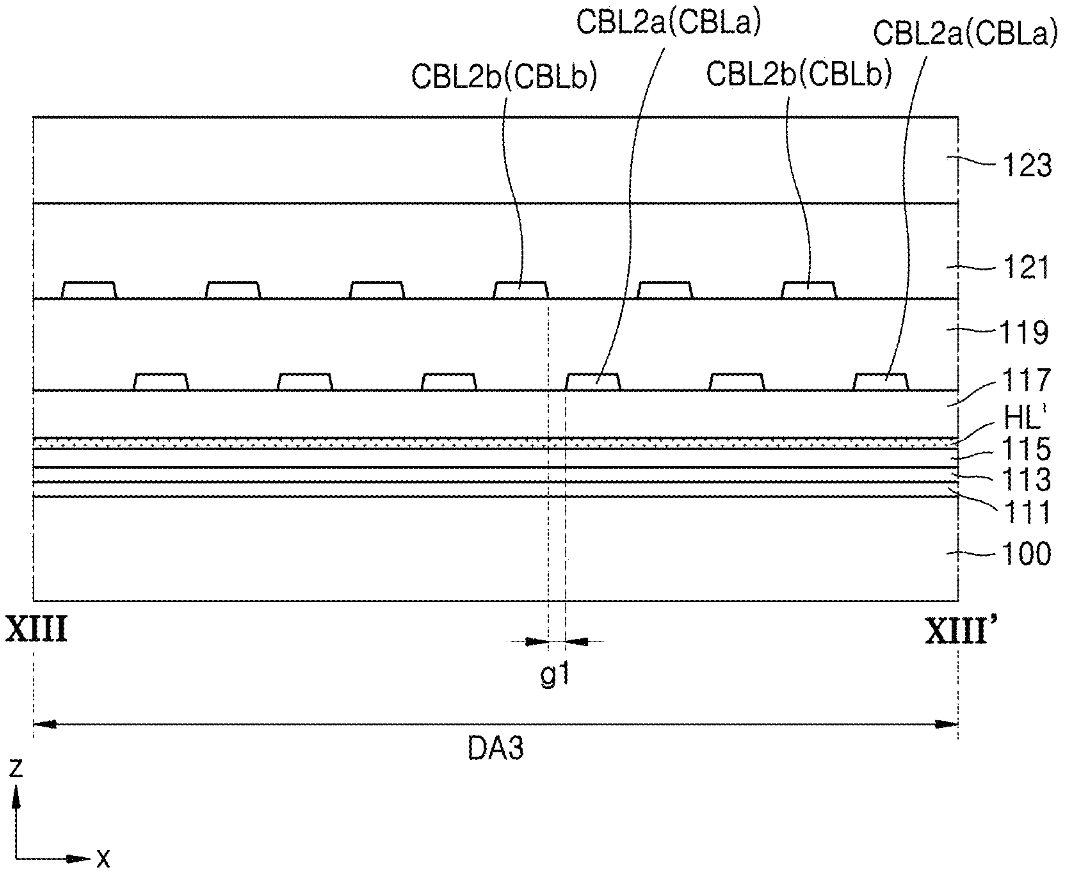
FIG. 13 is a cross-sectional view of the display panel of FIG. 12, taken along the line XIII-XIII'.

FIG. 13 is a cross-sectional view of the display panel, taken along the line XIII-XIII' shown in FIG. 12.

Referring to FIGS. 12 and 13, the conductive bus lines CBL (see FIG. 12) adjacent to each other may be arranged on different layers in the third display area DA3. At least one insulating layer may be arranged between the second portion CBL2*a* of the first conductive bus line CBLa and the second portion CBL2*b* of the second conductive bus line CBLb. The first organic insulating layer 119 may be arranged between the second portion CBL2*a* of the first conductive bus line CBLa and the second portion CBL2*b* of the second conductive bus line CBLb. The second portion CBL2*a* of the first conductive bus line CBLa may be arranged below the first organic insulating layer 119. The second portion CBL2*b* of the second conductive bus line CBLb may be arranged over the first organic insulating layer 119. The second portion CBL2*a* of the first conductive bus line CBLa and the second portion CBL2*b* of the second conductive bus line CBLb may be arranged on different layers and may not overlap each other.

Because the first conductive bus line CBLa and the second conductive bus line CBLb adjacent to each other in the third display area DA3 are arranged on different layers, a first gap g1 between the first conductive bus line CBLa and the second conductive bus line CBLb may be formed to be relatively small, and accordingly, a space in the third display area DA3 may be efficiently used.

In the third display area DA3, the first conductive bus line CBLa and the second conductive bus line CBLb may be arranged in the first direction (e.g., the x-direction) and may overlap the electrode voltage line HL' therebelow.

The electrode voltage line HL' described above with reference to FIG. 7 may extend in the first direction (e.g., the x-direction) in the third display area DA3, and the first conductive bus line CBLa and the second conductive bus line CBLb extending in the second direction (e.g., the y-direction) may each overlap the electrode voltage line HL' in the third display area DA3.

The second portion CBL2*a* of the first conductive bus line CBLa and the second portion CBL2*b* of the second conductive bus line CBLb may each include metal. As an example, the second portion CBL2*a* of the first conductive bus line CBLa and the second portion CBL2*b* of the second conductive bus line CBLb may each include a metal material such as molybdenum (Mo), aluminum (Al), copper (Cu), and/or titanium (Ti) and include a single layer or a multi-layer including the above materials. As an example, the second portion CBL2*a* of the first conductive bus line CBLa and the second portion CBL2*b* of the second conductive bus line CBLb may each have a multi-layered structure such as, Ti/Al/Ti.

Figure 14:
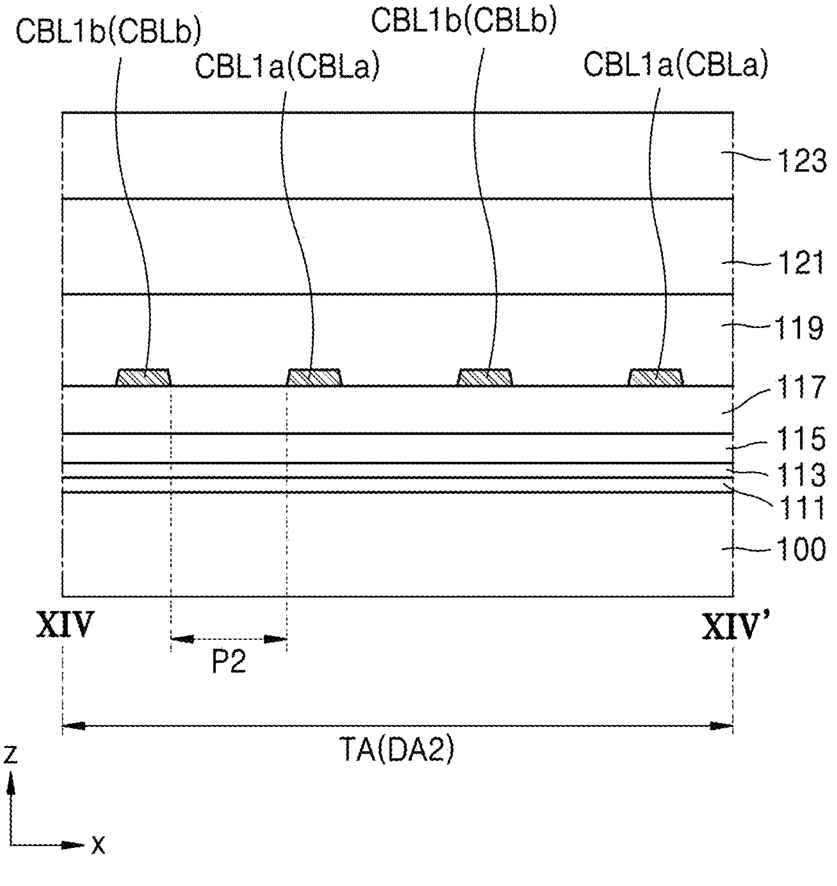
FIG. 14 is a cross-sectional view of the display panel of FIG. 12, taken along the line XIV-XIV'.

FIG. 14 is a cross-sectional view of the display panel, taken along the line XIV-XIV' shown in FIG. 12.

Referring to FIGS. 12 and 14, the conductive bus lines CBL (see FIG. 12) adjacent to each other may be arranged on the same layers in the second display area DA2. The first portion CBL1*a* of the first conductive bus line CBLa and the first portion CBL1*b* of the second conductive bus line CBLb may be arranged on the same layer. Accordingly, FIG. 14 shows that the first portion CBL1*a* of the first conductive bus line CBLa and the first portion CBL1*b* of the second conductive bus line CBLb are arranged on the second interlayer insulating layer 117.

A second gap g2 between the first portion CBL1*a* of the first conductive bus line CBLa and the first portion CBL1*b* of the second conductive bus line CBLb adjacent to each other may be greater than the first gap g1 (see FIG. 13).

Because the first portion CBL1*a* of the first conductive bus line CBLa and the first portion CBL1*b* of the second conductive bus line CBLb adjacent to each other pass across (e.g., cross) the transmission area TA of the second display area DA2, the first portion CBL1*a* of the first conductive bus line CBLa and the first portion CBL1*b* of the second conductive bus line CBLb may include a light transmissive material such as indium tin oxide (ITO), indium zinc oxide (IZO), zinc oxide (ZnO), indium oxide ($In_2O_3$), indium gallium oxide (IGO), and indium zinc gallium oxide (IZGO), or a transparent conductive oxide such as aluminum zinc oxide (AZO).

Figure 15:
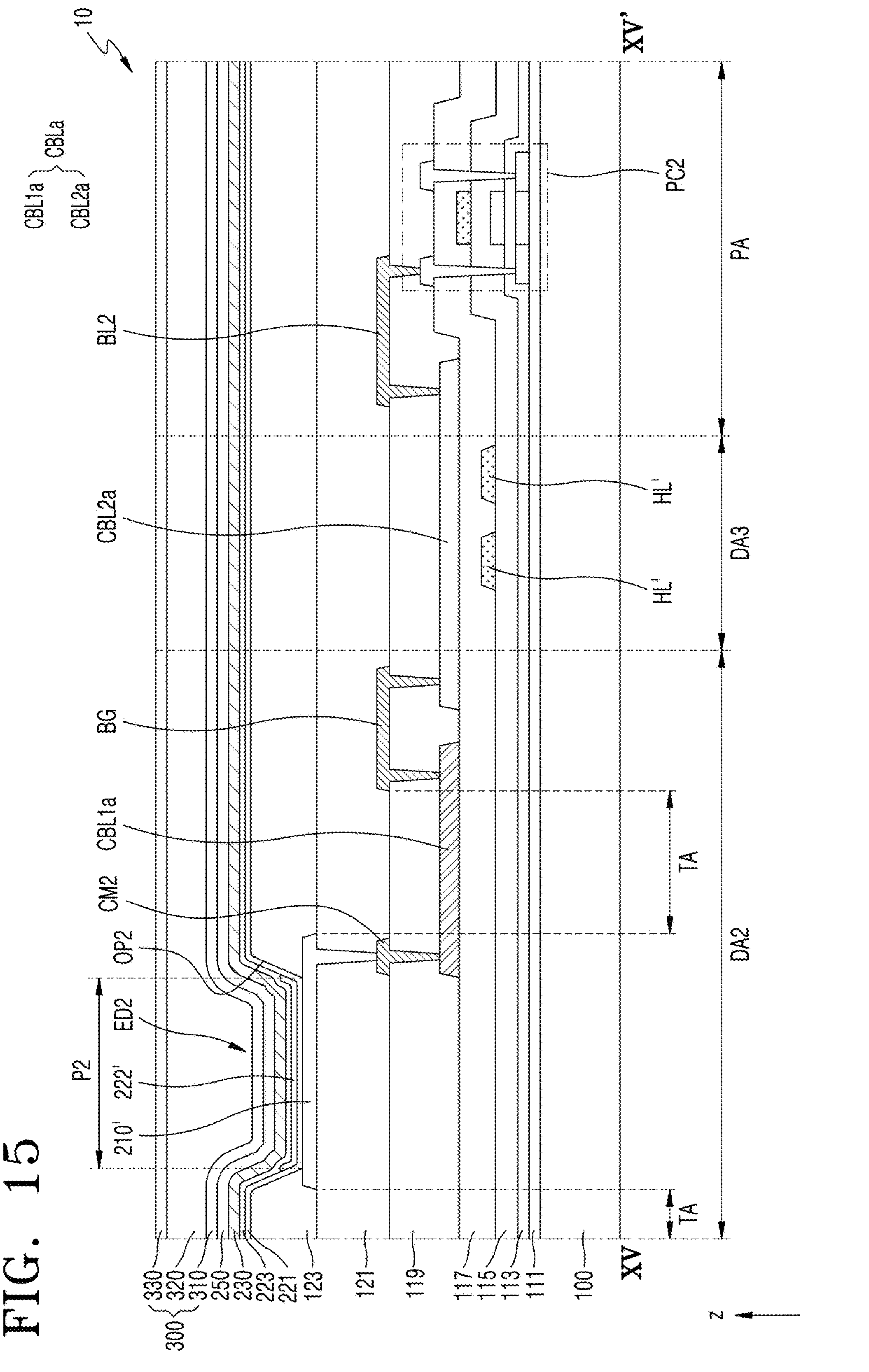
FIG. 15 is a cross-sectional view of the display panel of FIG. 12, taken along the line XV-XV'.

FIG. 15 is a cross-sectional view of the display panel, taken along the line XV-XV' shown in FIG. 12. FIG. 15 shows a structure in which the second sub-pixel circuit PC2 in the peripheral area PA (see FIG. 12) is electrically connected to the second light-emitting diode ED2 through the first conductive bus line CBLa.

Referring to FIG. 15, the second sub-pixel circuit PC2 and the second light-emitting diode ED2 are arranged over the substrate 100. The second sub-pixel circuit PC2 may be arranged in the peripheral area PA and may include the thin-film transistor and the storage capacitor. The materials of the thin-film transistor and the storage capacitor of the second sub-pixel circuit PC2 may be the same as those of the first sub-pixel circuit PC1 of FIG. 11 and will not be repeated here. The planar shape of the second sub-pixel circuit PC2 is the same as that described with reference to FIG. 7 and will not be repeated here.

The second light-emitting diode ED2 arranged in the second display area DA2 may include a first electrode 210', an emission layer 222', and the second electrode 230. The first electrode 210' of the second light-emitting diode ED2 may include the same material as that of the first electrode 210 (see FIG. 11) of the first light-emitting diode ED1 (see FIG. 11) described above.

The edges of the first electrode 210' of the second light-emitting diode ED2 may be covered by the bank layer 123. The bank layer 123 includes a second opening OP2 overlapping the central portion of the first electrode 210' of the second light-emitting diode ED2. The second opening OP2 of the bank layer 123 may correspond to an emission area of the second light-emitting diode ED2, that is, the second sub-pixel P2. In other words, the size and shape of the second opening OP2 may be defined by the size and shape of the second sub-pixel P2.

The emission layer 222' of the second light-emitting diode ED2 may include a polymer organic material or a low molecular weight organic material that may emit red, green, or blue light. The second electrode 230 may be formed as one body to cover the display area entirely. The first and second functional layers 221 and 223 may be further included between the first electrode 210' and the second electrode 230 of the second light-emitting diode ED2.

The second sub-pixel circuit PC2 of the peripheral area PA is electrically connected to the second light-emitting diode ED2 by a conductive bus line, for example, the first conductive bus line CBLa. The first conductive bus line CBLa may include the first portion CBL1*a* and the second portion CBL2*a*, the first portion CBL1*a* being arranged in the second display area DA2, and the second portion CBL2*a* being arranged in the third display area DA3. The first portion CBL1*a* and the second portion CBL2*a* may include different materials. As described above with reference to FIGS. 13 and 14, the first portion CBL1*a* may include a transparent conductive oxide, and the second portion CBL2*a* may include metals such as titanium and aluminum. As described above with reference to FIG. 13, the second portion CBL2*a* may overlap the electrode voltage line HL' arranged therebelow and extend in a direction crossing the second portion CBL2*a*.

The first portion CBL1*a* and the second portion CBL2*a* may be arranged on the same layer, for example, the second interlayer insulating layer 117 but formed by different processes. The first portion CBL1*a* may be electrically connected to the second portion CBL2*a* through a bridge electrode BG. The bridge electrode BG may be arranged on the first organic insulating layer 119. The bridge electrode BG may be connected to the first portion CBL1*a* and the second portion CBL2*a* through contact holes passing through the first organic insulating layer 119. The first portion CBL1*a* may be electrically connected to the first electrode 210' of the second light-emitting diode ED2 through the second contact metal CM2. The second portion CBL2*a* may be electrically connected to the second sub-pixel circuit PC2 through a second bridge line BL2.

The bridge electrode BG, the second contact metal CM2, and the second bridge line BL2 may include a metal material including molybdenum (Mo), aluminum (Al), copper (Cu), and/or titanium (Ti) and have a single-layered structure or a multi-layered structure including the above materials.

The configuration of the capping layer 250 and the encapsulation layer 300 including the first inorganic encapsulation layer 310, the organic encapsulation layer 320, and the second inorganic encapsulation layer 330 on the second light-emitting diode ED2 are the same as that described above.

Although it is described in FIG. 15 that the first portion CBL1*a* is electrically connected to the second portion CBL2*a* through the bridge electrode BG, the embodiment is not limited thereto. In other embodiments, ends of the first portion CBL1*a* and the second portion CBL2*a* may directly overlap each other. In some embodiments, in the case where the first portion CBL1*a* is arranged on the second portion CBL2*a* and the thickness of the first portion CBL1*a* is relatively thin, then in the case where a step coverage of the first portion CBL1*a* formed while covering a step difference between the upper surface of the second interlayer insulating layer 117 and the upper surface of the second portion CBL2*a* is not good, electric connection between the first portion CBL1*a* and the second portion CBL2*a* may be difficult (e.g., when there is poor conductivity between first portion CBL1*a* and second portion CBL2*a*). In this case, as shown in FIG. 15, it may be more preferable that the electric connection is formed by using the bridge electrode BG.

Figure 16:
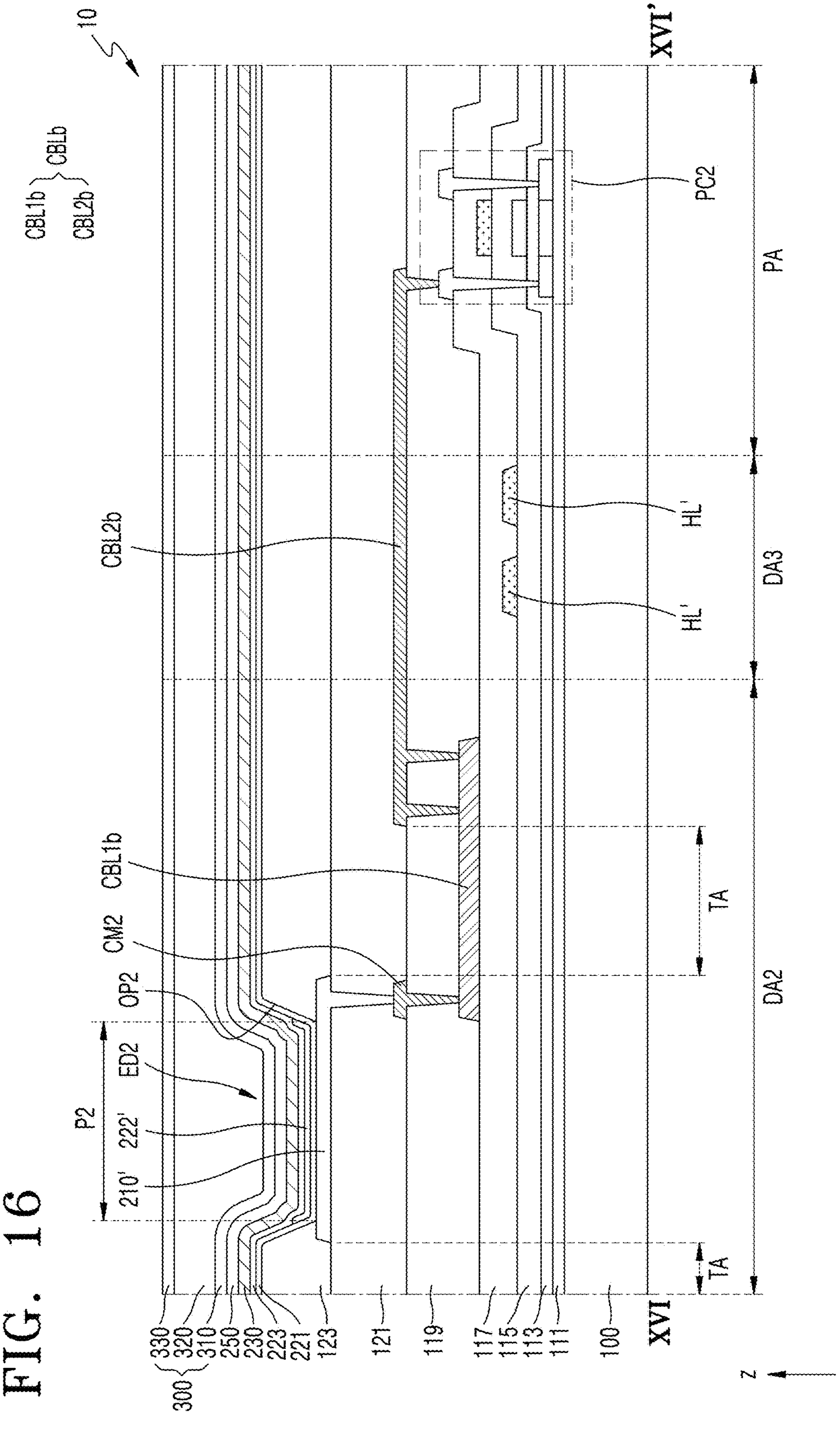
FIG. 16 is a cross-sectional view of the display panel of FIG. 12, taken along the line XVI-XVI'.

FIG. 16 is a cross-sectional view of the display panel, taken along line XVI-XVI' shown in FIG. 12. FIG. 16 shows a structure in which the second sub-pixel circuit PC2 of the peripheral area PA (see FIG. 12) is electrically connected to the second light-emitting diode ED2 through the second conductive bus line CBLb. In FIG. 16, the same reference numerals are used for the same elements as those of FIG. 15, and differences are mainly described below.

Referring to FIG. 16, the second sub-pixel circuit PC2 and the second light-emitting diode ED2 are arranged over the substrate 100. The second sub-pixel circuit PC2 is arranged in the peripheral area PA, the second light-emitting diode ED2 is arranged in the second display area DA2, and the first electrode 210 of the second light-emitting diode ED2 may be electrically connected to the second sub-pixel circuit PC2 by a conductive bus line, for example, the second conductive bus line CBLb.

The second conductive bus line CBLb may include the first portion CBL1*b* and the second portion CBL2*b*, the first portion CBL1*b* passing across (e.g., crossing) the second display area DA2, and the second portion CBL2*b* passing across (e.g., crossing) the third display area DA3. The first portion CBL1*b* and the second portion CBL2*b* may include different materials. As described above with reference to FIGS. 13 and 14, the first portion CBL1*b* may include a transparent conductive oxide, and the second portion CBL2*b* may include metals such as titanium and/or aluminum. As described above with reference to FIG. 13, the second portion CBL2*b* may overlap the electrode voltage line HL' arranged therebelow and extending in a direction crossing the second portion CBL2*a*.

The first portion CBL1*b* and the second portion CBL2*b* may be arranged on different layers. The first portion CBL1*b* may be arranged on the second interlayer insulating layer 117, and the second portion CBL2*b* may be arranged on the first organic insulating layer 119. The second portion CBL2*b* may directly contact the first portion CBL1*b* through a contact hole passing through the first organic insulating layer 119. Although it is shown in FIG. 16 that the second portion CBL2*b* is connected to the first portion CBL1*b* through two contact holes, the number of contact holes may be one or three or more.

The first portion CBL1*b* may be electrically connected to the first electrode 210' of the second light-emitting diode ED2 through the second contact metal CM2, and the second portion CBL2*b* may be electrically connected to the second sub-pixel circuit PC2.

Figure 17:
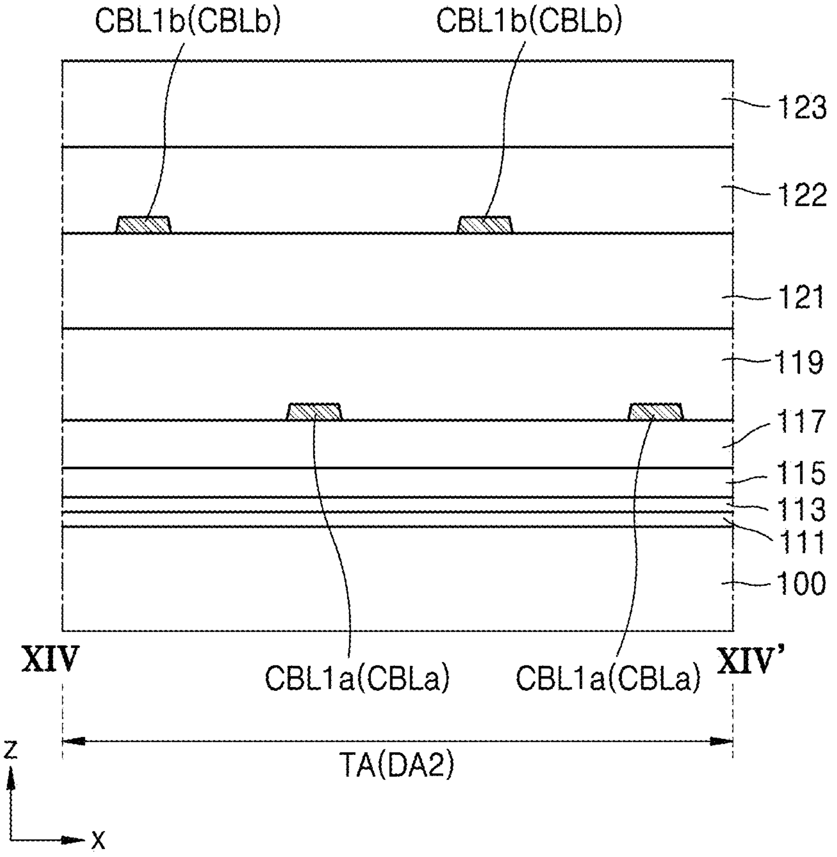
FIG. 17 is a cross-sectional view of the display panel of FIG. 12, according to some embodiments, taken along the line XIV-XIV'.

FIG. 17 is a cross-sectional view of the display panel according to other embodiments, taken along the line XIV-XIV' of FIG. 12. Referring to FIG. 17, the display panel further comprises a third organic insulating layer 122.

Referring to FIGS. 12 and 17, the conductive bus lines CBL (see FIG. 12) adjacent to each other may be arranged on different layers in the second display area DA2. As an example, the first portion CBL1*a* of the first conductive bus line CBLa and the first portion CBL1*b* of the second conductive bus line CBLb may be arranged on different layers. Accordingly, it is shown in FIG. 17 that the first portion CBL1*a* of the first conductive bus line CBLa is arranged on the second interlayer insulating layer 117, and the first portion CBL1*b* of the second conductive bus line CBLb is arranged on the second organic insulating layer 121 and covered by the third organic insulating layer 122.

Because the first portion CBL1*a* of the first conductive bus line CBLa and the first portion CBL1*b* of the second conductive bus line CBLb pass across (e.g., cross) the transmission area TA of the second display area DA2, the first portion CBL1*a* and the first portion CBL1*b* may include a light transmissive material, for example, a transparent conductive oxide such as indium tin oxide (ITO), indium zinc oxide (IZO), zinc oxide (ZnO), indium oxide ($In_2O_3$), indium gallium oxide (IGO), and indium zinc gallium oxide (IZGO), or aluminum zinc oxide (AZO).

Figure 18:
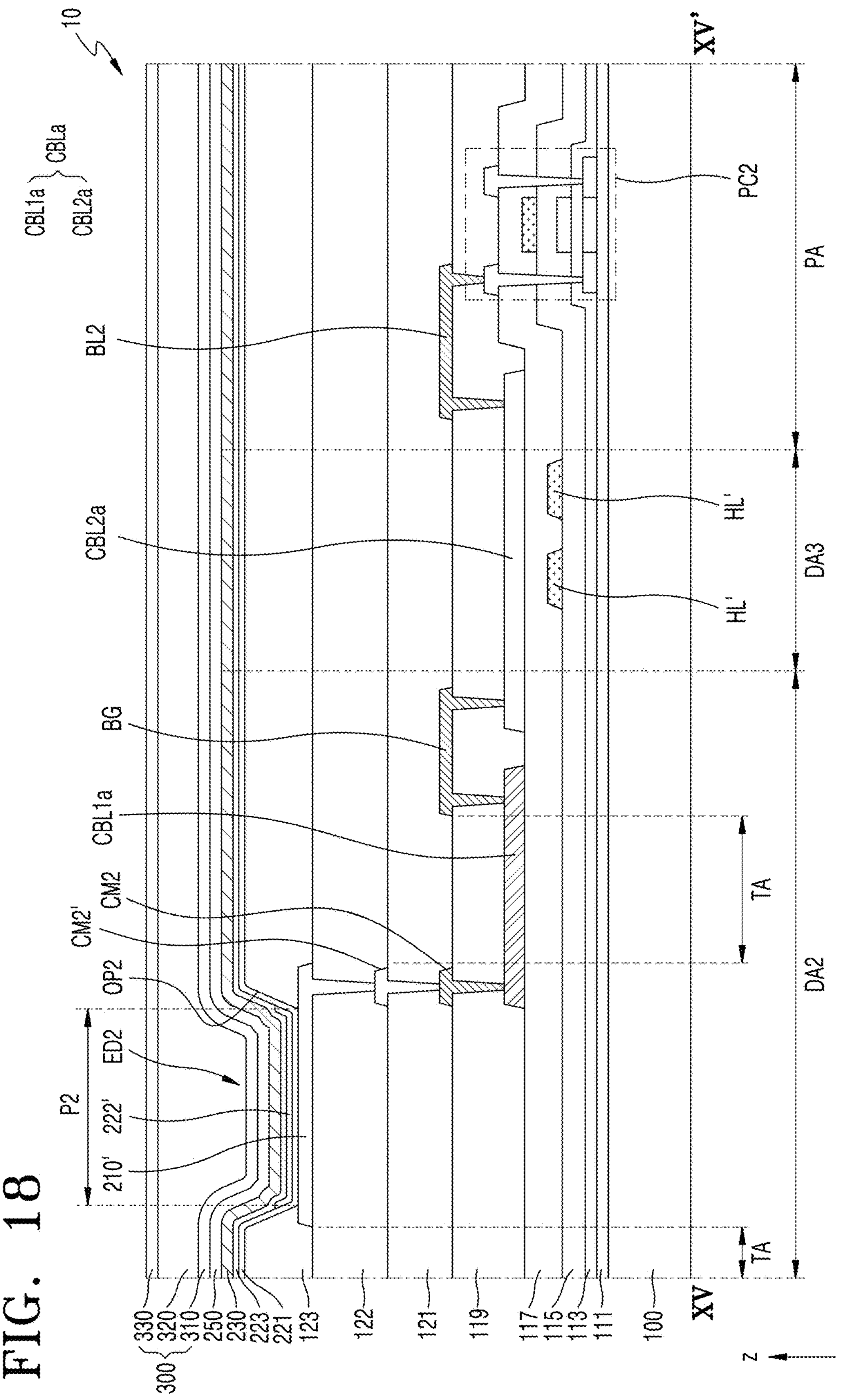
FIG. 18 is a cross-sectional view of the display panel of FIG. 12, according to some embodiments, taken along the line XV-XV'.

FIG. 18 is a cross-sectional view of the display panel according to other embodiments, taken along the line XV-XV' of FIG. 12. Unlike the cross-section of the display panel shown in FIG. 15, the cross-section of the display panel shown in FIG. 18 may further include the third organic insulating layer 122.

Referring to FIG. 18, the second sub-pixel circuit PC2 of the peripheral area PA is electrically connected to the second light-emitting diode ED2 of the second display area DA2. As an example, the second sub-pixel circuit PC2 is electrically connected to the second light-emitting diode ED2 by the first conductive bus line CBLa.

The first conductive bus line CBLa may include the first portion CBL1*a* and the second portion CBL2*a*, the first portion CBL1*a* being arranged in the second display area DA2, and the second portion CBL2*a* being arranged in the third display area DA3. The first portion CBL1*a* and the second portion CBL2*a* may include different materials. As described above with reference to FIGS. 13 and 14, the first portion CBL1*a* may include a transparent conductive oxide, and the second portion CBL2*a* may include metals such as titanium and/or aluminum. The second portion CBL2*a* may overlap the electrode voltage line HL' arranged therebelow and extend in a direction crossing the second portion CBL2*a*.

The first portion CBL1*a* and the second portion CBL2*a* may be arranged on the same layer, for example, the second interlayer insulating layer 117 but may be formed through different processes. The first portion CBL1*a* may be electrically connected to the second portion CBL2*a* through the bridge electrode BG. The bridge electrode BG may be arranged on the first organic insulating layer 119. The bridge electrode BG may be connected to the first portion CBL1*a* and the second portion CBL2*a* through contact holes passing through the first organic insulating layer 119. The first portion CBL1*a* may be electrically connected to the first electrode 210' of the second light-emitting diode ED2 through the second contact metals CM2 and CM2', and the second portion CBL2*a* may be electrically connected to the second sub-pixel circuit PC2 through the second bridge line BL2. One of the two second contact metals CM2 and CM2' (referred to as a (2-1)st contact metal CM2, hereinafter) may be arranged on the first organic insulating layer 119, and the other contact metal of the two second contact metals CM2 and CM2' (referred to as a (2-2)nd contact metal CM2', hereinafter) may be arranged between the second organic insulating layer 121 and the third organic insulating layer 122.

The bridge electrode BG, the (2-1)st contact metal CM2, and the second bridge line BL2 may include a metal material including molybdenum (Mo), aluminum (Al), copper (Cu), and/or titanium (Ti) and have a single-layered structure or a multi-layered structure including the above materials. The (2-2)nd contact metal CM2' may include the same material as those of the first portions CBL1*a* and CBL1*b* of the first and second conductive lines CBLa and CBLb.

Figure 19:
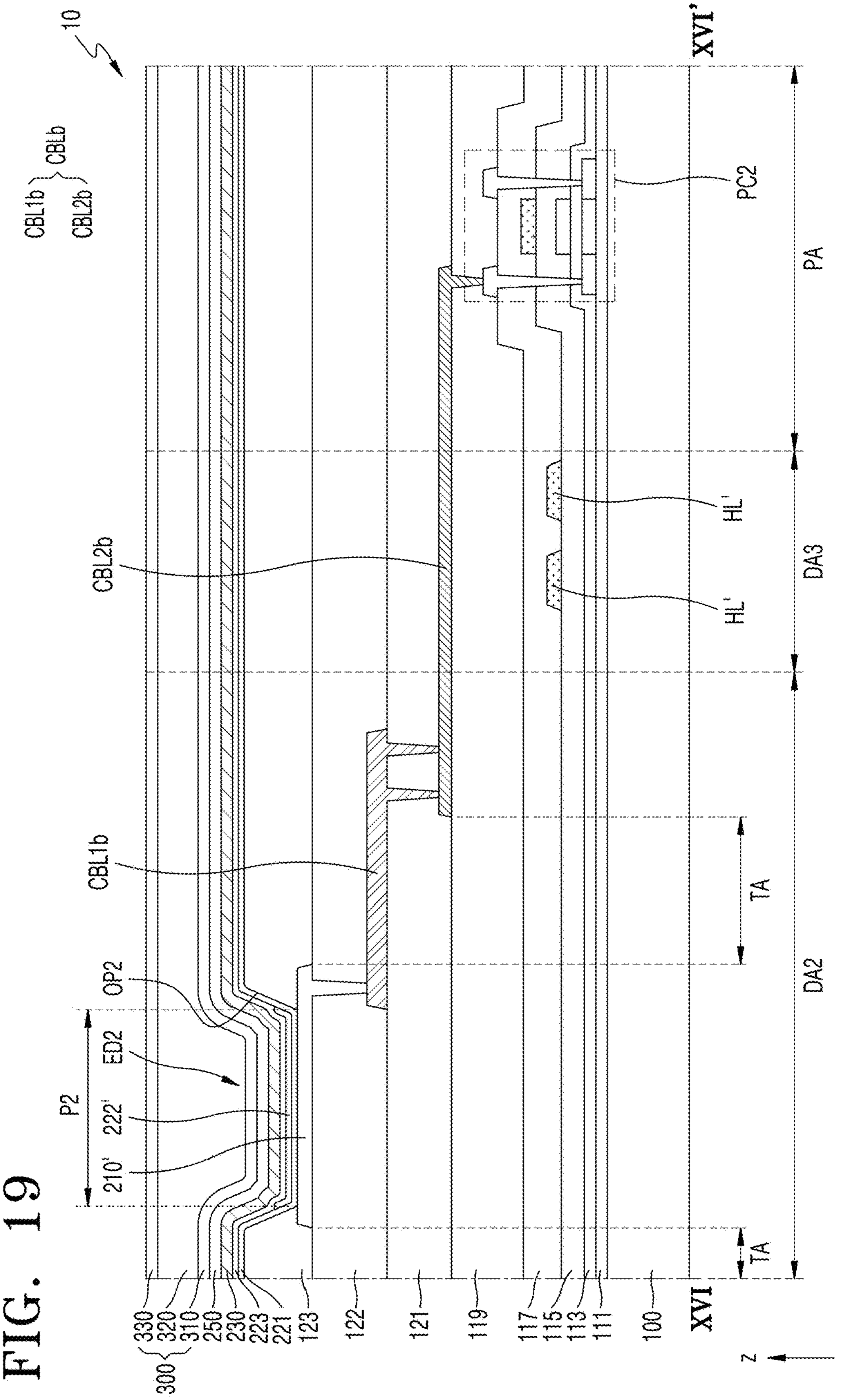
FIG. 19 is a cross-sectional view of the display panel of FIG. 12, according to some embodiments, taken along the line XVI-XVI'.

FIG. 19 is a cross-sectional view of the display panel according to another embodiment, taken along the line XVI-XVI' of FIG. 12. Unlike the cross-section of the display panel shown in FIG. 16, the cross-section of the display panel shown in FIG. 19 may further include the third organic insulating layer 122 and is different from the cross-section of the display panel shown in FIG. 16 in that the first portion CBL1*b* of the second conductive bus line CBLb is arranged on the second organic insulating layer 121.

Referring to FIG. 16, the second conductive bus line CBLb may include the first portion CBL1*b* and the second portion CBL2*b*, the first portion CBL1*b* passing across (e.g., crossing) the second display area DA2, and the second portion CBL2*b* passing across (e.g., crossing) the third display area DA3. The first portion CBL1*b* and the second portion CBL2*b* may include different materials. As described above with reference to FIGS. 13 and 14, the first portion CBL1*b* may include a transparent conductive oxide, and the second portion CBL2*b* may include metals such as titanium and/or aluminum. The second portion CBL2*b* may overlap the electrode voltage line HL' arranged therebelow and extend in a direction crossing the second portion CBL2*b*.

The first portion CBL1*b* and the second portion CBL2*b* may be arranged on different layers. The first portion CBL1*b* may be arranged on the second organic insulating layer 121, and the second portion CBL2*b* may be arranged on the first organic insulating layer 119. The first portion CBL1*b* may directly contact the second portion CBL2*b* through a contact hole passing through the second organic insulating layer 121. Although FIG. 19 shows that the first portion CBL1*b* is connected to the second portion CBL2*b* through two contact holes, the number of contact holes may be one or three or more.

The first portion CBL1*b* may be electrically connected to the first electrode 210 of the second light-emitting diode ED2 through a contact hole passing through the third organic insulating layer 122, and the second portion CBL2*b* may be electrically connected to the second sub-pixel circuit PC2 through a contact hole passing through the first organic insulating layer 119.

According to some embodiments, a display panel having excellent quality like arranging a second display area including a transmission area inside a display area, variously designing the position of the second display area that overlaps a component, and reducing (e.g., preventing) a deviation in image quality between first to third display areas, and an electronic apparatus including the display panel may be provided. These aspects are provided as examples and the scope of the present disclosure is not limited by these aspects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:

a display area comprising a first area, a second area, and a third area;

a peripheral area outside the display area;

a first light-emitting element in the first area;

a second light-emitting element and a transmission area in the second area;

a third light-emitting element in the third area;

a first pixel circuit electrically connected to the first light-emitting element;

a second pixel circuit electrically connected to the second light-emitting element;

a third pixel circuit electrically connected to the third light-emitting element; and a conductive line electrically connecting the second light-emitting element to the second pixel circuit in the peripheral area and crossing the third area between the peripheral area and the second area.

2. The display panel of claim 1, wherein the first light-emitting element is one of a plurality of first light-emitting elements in the first area, wherein the second light-emitting element is one of a plurality of second light-emitting elements in the second area, and wherein a number of the first light-emitting elements is different from a number of the second light-emitting elements.

3. The display panel of claim 2, wherein an arrangement of the plurality of first light-emitting elements is different from an arrangement of the plurality of second light-emitting elements.

4. The display panel of claim 3, wherein the third light-emitting element is one of a plurality of third light-emitting elements in the third area, and wherein an arrangement of the plurality of third light-emitting elements is the same as the arrangement of the plurality of second light-emitting elements.

5. The display panel of claim 1, wherein a size of the first light-emitting element is different from a size of the second light-emitting element.

6. The display panel of claim 1, wherein the second light-emitting element overlaps the conductive line.

7. The display panel of claim 1, wherein at least a portion of the conductive line comprises indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO).

8. The display panel of claim 1, wherein the conductive line comprises a first portion in the second area, and a second portion in the third area and electrically connected to the first portion, and wherein, in plan view, an electrical connection region of the first portion and the second portion is between the second light-emitting element and the third light-emitting element.

9. A display panel comprising:

a display area comprising a first area, a second area, and a third area;

a first light-emitting element in the first area;

a second light-emitting element and a transmission area in the second area;

a third light-emitting element in the third area;

a first pixel circuit electrically connected to the first light-emitting element and in the first area;

a second pixel circuit electrically connected to the second light-emitting element and in another area different from the second area;

a third pixel circuit electrically connected to the third light-emitting element and in the third area;

a dummy pixel circuit in the third area; and a conductive line electrically connecting the second light-emitting element to the second pixel circuit and crossing the third area.

10. The display panel of claim 9, wherein, in plan view, the other area is opposite to the second area with the third area between the second area and the other area.

11. The display panel of claim 10, wherein the other area comprises a non-display area.

12. The display panel of claim 9, wherein the conductive line comprises a first portion in the second area, and a second portion in the third area and electrically connected to the first portion, and wherein, in plan view, an electrical connection region of the first portion and the second portion is between the second light-emitting element and the third light-emitting element.

13. The display panel of claim 12, wherein the first portion of the conductive line comprises indium tin oxide (ITO), indium zinc oxide (IZO), zinc oxide (ZnO), indium oxide ($In_2O_3$), indium gallium oxide (IGO), indium zinc gallium oxide (IZGO), or aluminum zinc oxide (AZO).

14. An electronic apparatus comprising:

a display panel comprising a display area, the display area comprising a first area, a second area, and a third area; and a component below the display panel and overlapping a transmission area in the second area of the display panel, the component comprising a sensor or a camera, wherein the display panel further comprises:

a first light-emitting element in the first area;

a second light-emitting element in the second area;

a third light-emitting element in the third area;

a first pixel circuit electrically connected to the first light-emitting element and in the first area;

a second pixel circuit electrically connected to the second light-emitting element and in another area different from the second area;

a third pixel circuit electrically connected to the third light-emitting element and in the third area; and a conductive line electrically connecting the second light-emitting element to the second pixel circuit and crossing the third area between the other area and the second area.

15. The electronic apparatus of claim 14, wherein the first light-emitting element is one of a plurality of first light-emitting elements in the first area, wherein the second light-emitting element is one of a plurality of second light-emitting elements in the second area, and wherein a number of the first light-emitting elements is different from a number of the second light-emitting elements.

16. The electronic apparatus of claim 15, wherein an arrangement of the plurality of the first light-emitting elements is different from an arrangement of the plurality of second light-emitting elements.

17. The electronic apparatus of claim 14, wherein a size of the first light-emitting element is different from a size of the second light-emitting element.

18. The electronic apparatus of claim 14, wherein the second light-emitting element overlaps the conductive line.

19. The electronic apparatus of claim 14, wherein the conductive line comprises a first portion in the second area, and a second portion in the third area and electrically connected to the first portion, and wherein, in plan view, an electrical connection region of the first portion and the second portion is between the second light-emitting element and the third light-emitting element.

20. The electronic apparatus of claim 14, wherein the display panel further comprises a dummy pixel circuit in the third area.

* * * * *